(12) United States Patent
Yamagata et al.

(10) Patent No.: US 6,893,887 B2
(45) Date of Patent: May 17, 2005

(54) PROCESS FOR PRODUCING A LIGHT EMITTING DEVICE

(75) Inventors: Hirokazu Yamagata, Tokyo (JP); Hisao Ikeda, Kanagawa (JP); Yoshimi Adachi, Nagano (JP); Noriko Miyagi, Kanagawa (JP); Tatsuya Arao, Kanagawa (JP); Koji Ono, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 17 days.

(21) Appl. No.: 10/051,895

(22) Filed: Jan. 17, 2002

(65) Prior Publication Data

US 2002/0110940 A1 Aug. 15, 2002

(30) Foreign Application Priority Data

Jan. 18, 2001 (JP) ...................................... 2001-010735

(51) Int. Cl.[7] .............................................. H01L 21/00
(52) U.S. Cl. ......................................................... 438/22
(58) Field of Search ............................. 134/1.3; 438/22, 438/26, 689, 690, 691, 692

(56) References Cited

U.S. PATENT DOCUMENTS

| | | | |
|---|---|---|---|
| 4,891,334 A | 1/1990 | Satoh et al. | |
| 5,447,824 A | 9/1995 | Mutsaers et al. | 430/315 |
| 5,550,066 A | 8/1996 | Tang et al. | |
| 5,669,979 A | 9/1997 | Elliott et al. | 134/1 |
| 5,853,905 A | 12/1998 | So et al. | 428/690 |
| 5,929,561 A | 7/1999 | Kawami et al. | |
| 6,120,584 A | 9/2000 | Sakata et al. | 96/135 |
| 6,150,668 A | 11/2000 | Bao et al. | 257/40 |
| 6,187,684 B1 | 2/2001 | Farber et al. | 438/704 |
| 6,194,837 B1 | 2/2001 | Ozawa | 315/169.1 |
| 6,218,206 B1 | 4/2001 | Inoue et al. | 438/30 |
| 6,246,179 B1 | 6/2001 | Yamada | 315/169.2 |
| 6,308,369 B1 | 10/2001 | Garcia et al. | 15/230 |
| 6,720,198 B2 | 4/2004 | Yamagata et al. | 438/29 |
| 2001/0041270 A1 | 11/2001 | Maruyama et al. | 428/690 |
| 2002/0018153 A1 | 2/2002 | Kitabayashi | 349/40 |
| 2002/0024493 A1 | 2/2002 | Ozawa et al. | 345/92 |
| 2002/0066902 A1 | 6/2002 | Takatoku | 257/72 |
| 2002/0071995 A1 | 6/2002 | Montgomery et al. | 430/5 |
| 2002/0110940 A1 | 8/2002 | Yamagata et al. | 438/22 |
| 2002/0113248 A1 | 8/2002 | Yamagata et al. | 257/187 |
| 2002/0153831 A1 | 10/2002 | Sakakura et al. | 313/504 |

FOREIGN PATENT DOCUMENTS

| | | |
|---|---|---|
| EP | 0 962 984 A2 | 12/1999 |
| EP | 0 993 235 A2 | 4/2000 |
| JP | 9-245965 | 9/1997 |
| JP | 11-224781 | 8/1999 |
| JP | 11-271753 | 10/1999 |
| WO | WO 99/48338 | 9/1999 |

OTHER PUBLICATIONS

JP 9–245965 English abstract.
O'Brien, D.F. et al, "Improved Energy Transfer in Electro-phosphorescent Devices," Applied Physics Letters, vol. 74, No. 3, pp. 442–444, Jan. 18, 1999.
Tsutsui, T. et al, "High Quantum Efficiency in Organic Light–Emitting Devices with Iridium–Complex as a Triplet Emissive Center," Japanese Journal of Applied Physics, vol. 38, part 2, No. 12B, pp. L 1502–L 1504, Dec. 15, 1999.
Miyashita, S. et al, "Full Color Displays Fabricated by Ink–Jet Printing," Asia Display/IDW '01, pp. 1399–1402 (2001).

*Primary Examiner*—David Zarneke
*Assistant Examiner*—Scott B. Geyer
(74) *Attorney, Agent, or Firm*—Cook, Alex, McFarron, Manzo, Cummings & Mehler, Ltd.

(57) ABSTRACT

The surface of an anode is made flat by wiping/cleaning of the present invention. Thereafter, an organic compound layer and a cathode are formed to produce a light emitting element. In this way, the distance between the anode and the cathode becomes constant. Therefore, when an electric field is applied to the light emitting element, the current density in the organic compound layer becomes uniform. Thus, it is possible to prevent the deterioration of the organic compound layer and improve the element characteristic thereof.

77 Claims, 17 Drawing Sheets

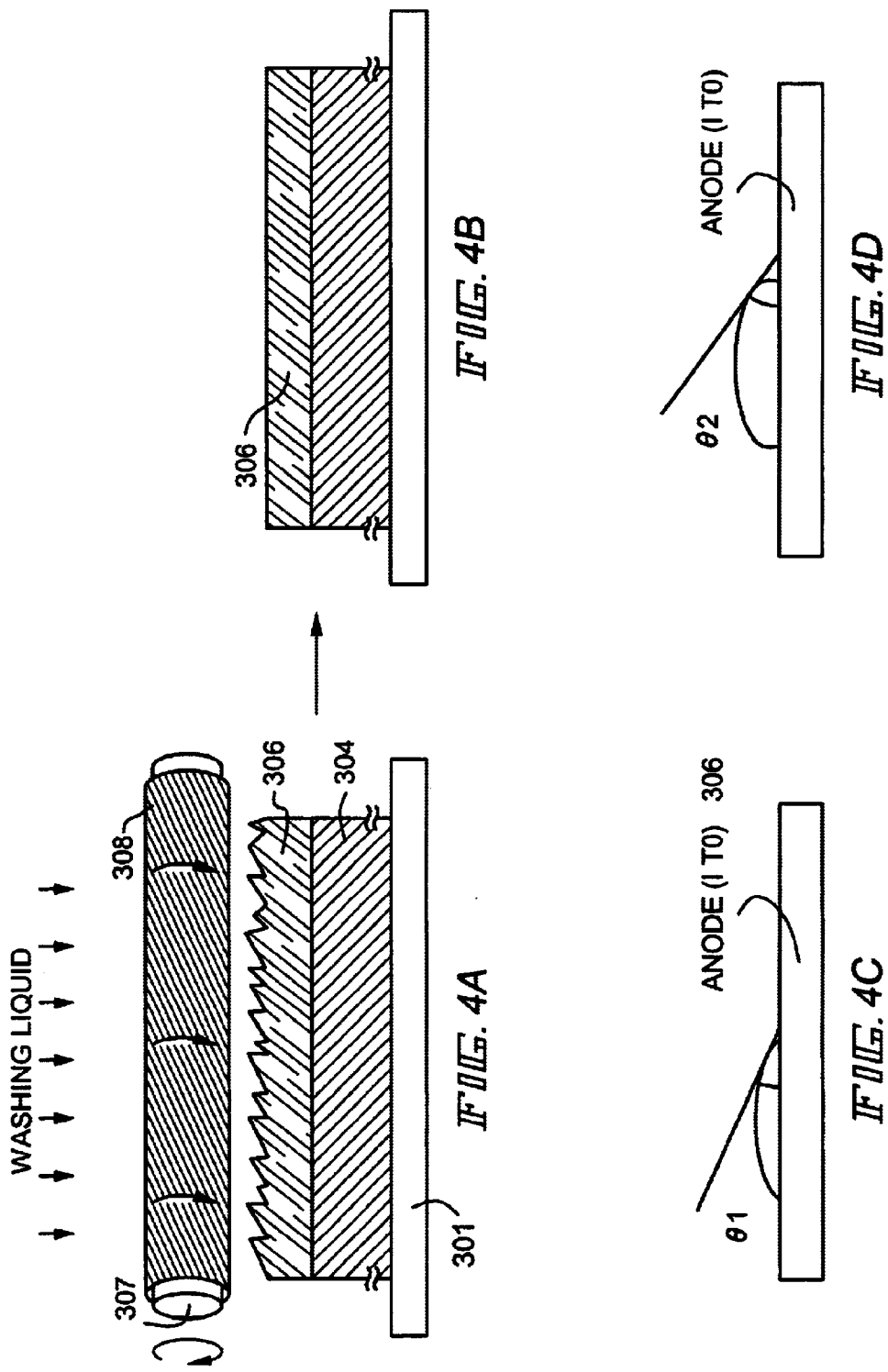

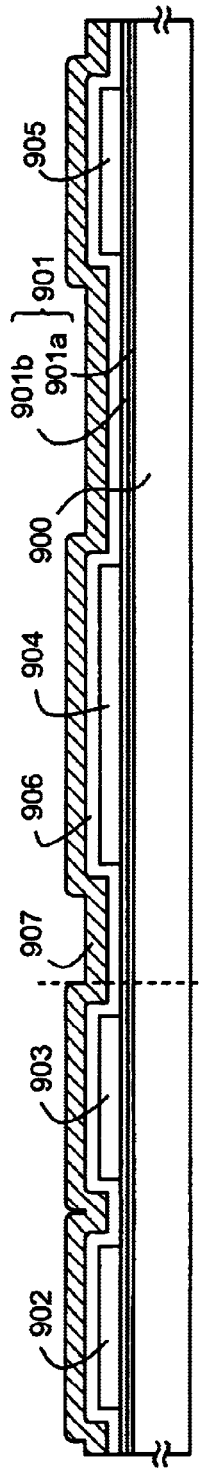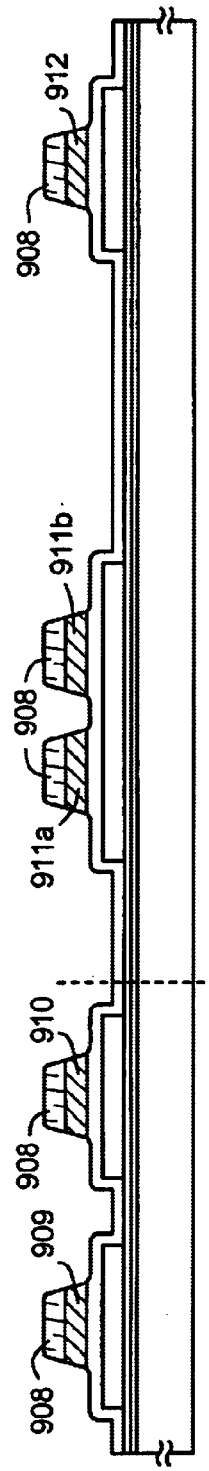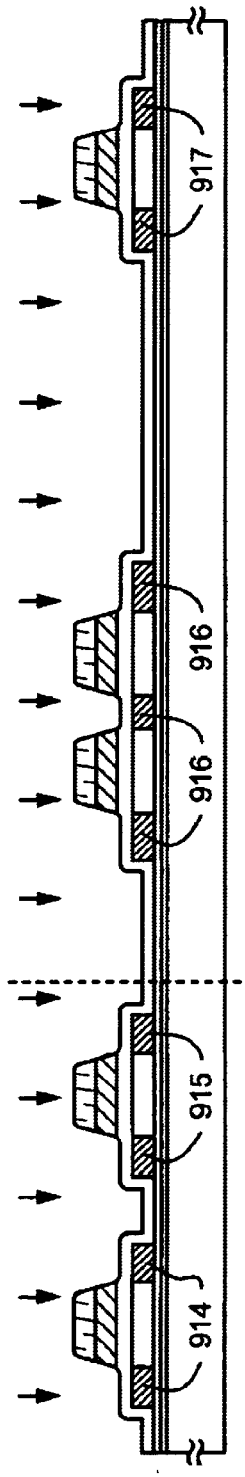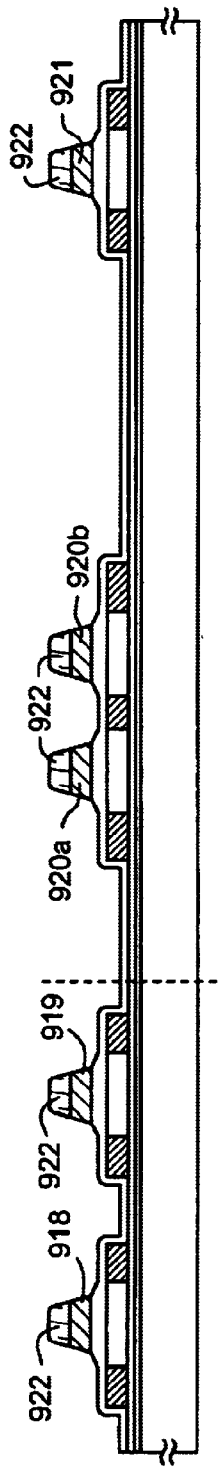

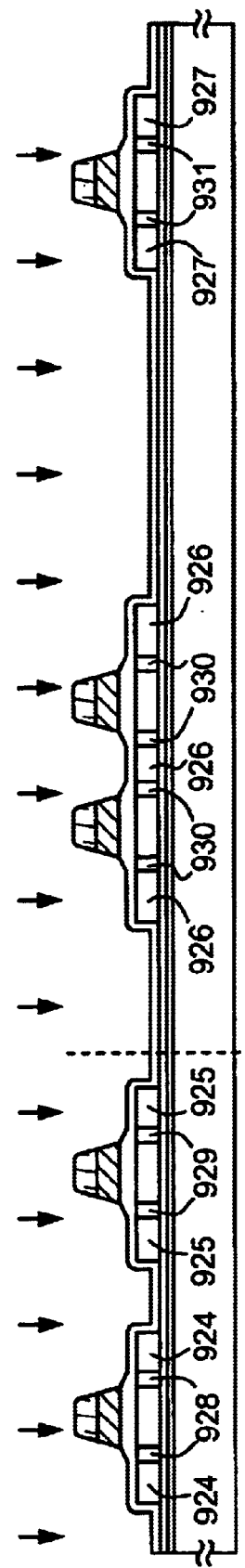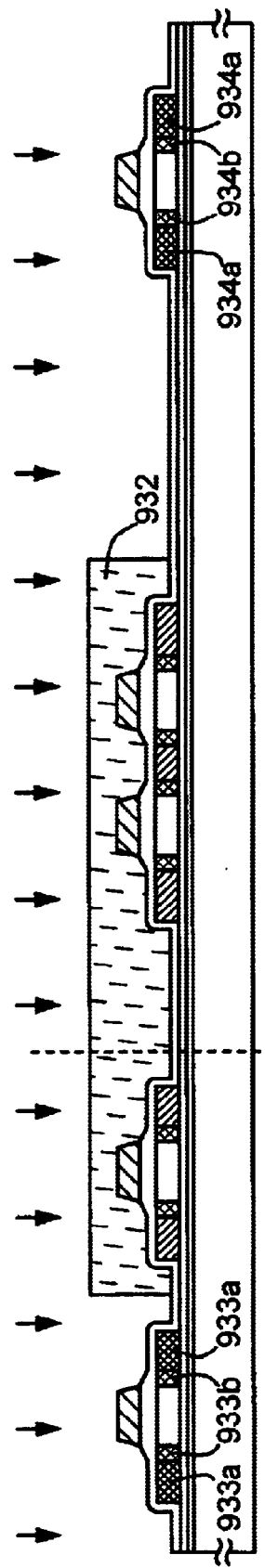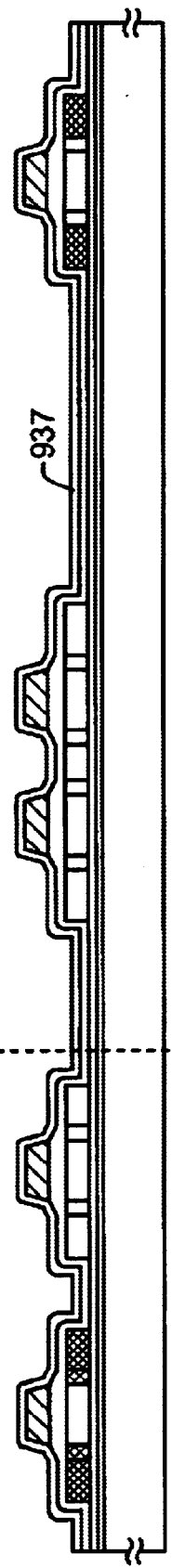
FIG. 9A
FIG. 9B
FIG. 9C

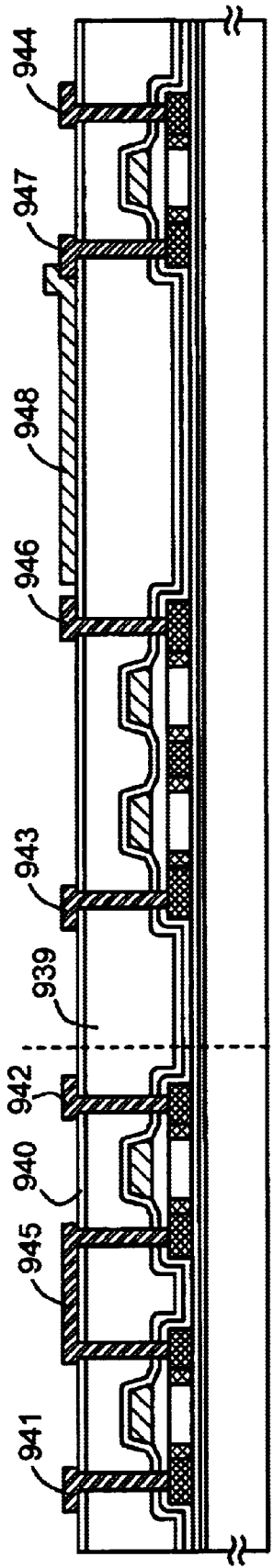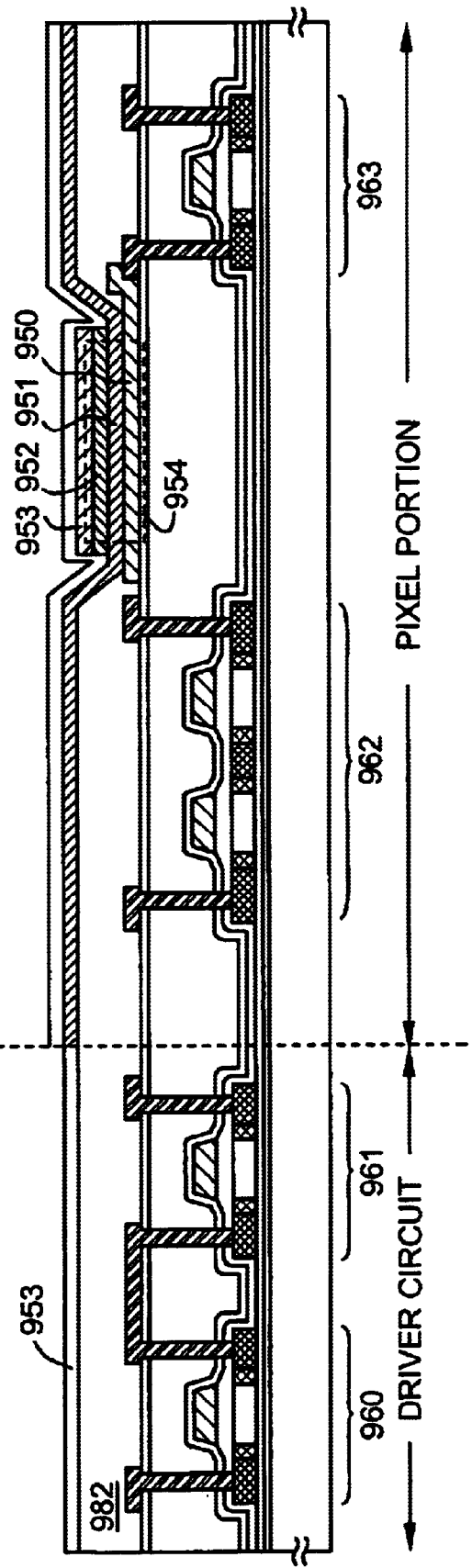
FIG. 11A
FIG. 11B

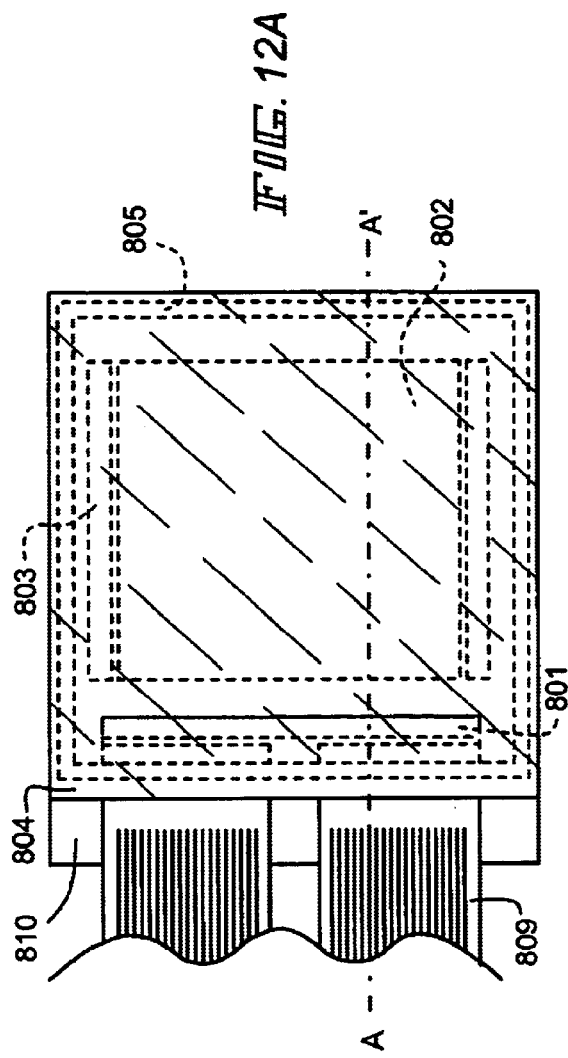
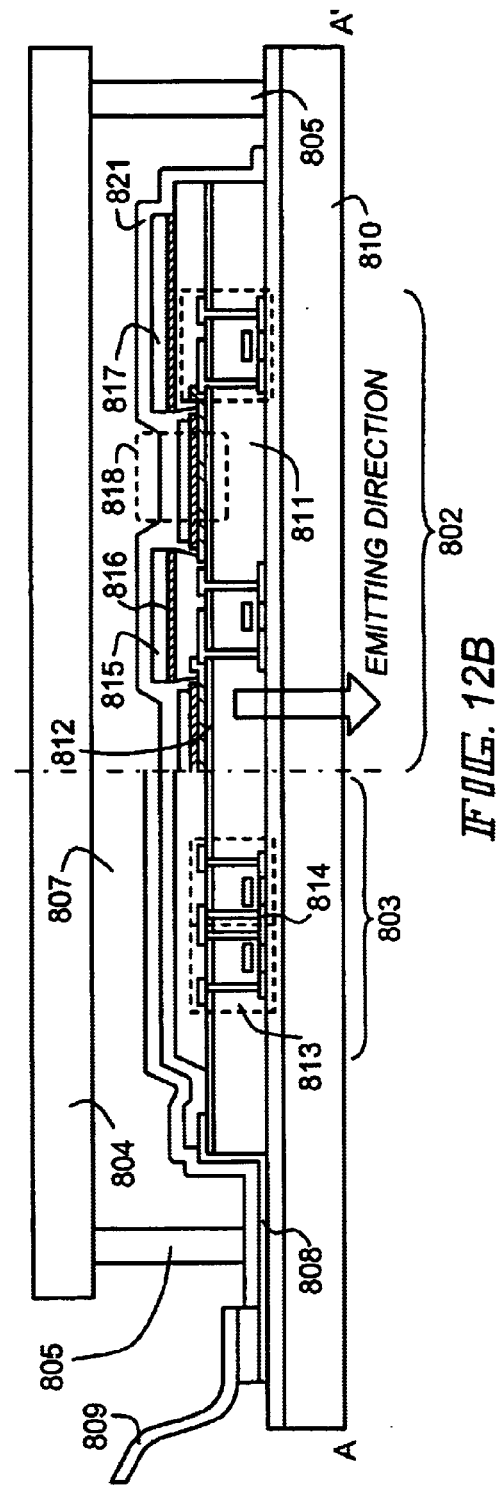

BEFORE ITO
SURFACE CLEANING

ITO SURFACE CLEANING

PROCESS FOR PRODUCING A LIGHT EMITTING DEVICE

BACKGROUND OF THE INVENTION

1. Field of the Invention

The present invention relates to a process for producing light emitting device using a light emitting element having a film containing an organic compound which can give luminescence by receiving an electric field (the film being referred to as an "organic compound layer" hereinafter), an anode, and a cathode. The present invention relates particularly to a light emitting device using a light emitting element having a lower driving voltage and a longer life span than conventional light emitting elements. The light emitting device referred to in the present specification is an image display device or a light emitting device using a light emitting element. Additionally, a module wherein a connector, for example, an anisotropic conductive film (such as a flexible printed circuit (FPC) or a tape automated bonding (TAB) tape, or a tape carrier package (TCP)) is set up onto a light emitting element; a module wherein a printed wiring board is set to the tip of a TAB tape or a TCP; and a module wherein integrated circuits (IC) are directly mounted on a light emitting element in a chip on glass (COG) manner are included in examples of the light emitting device.

2. Description of the Related Art

A light emitting element is an element which emits light by receiving an electric field. It is said that the luminescence mechanism thereof is based on the following phenomenon: by applying a voltage to an organic compound layer sandwiched between electrodes, electrons injected from the cathode and holes injected from the anode are recombined in the light emitting center of the organic compound layer to form molecular excimers; and energy is radiated when the molecular excimers return to the ground state thereof.

The kinds of the molecular excimers which are made from the organic compound may be a singlet exciting state excimer or a triplet exciting state excimer. In the specification, luminescence (that is, light emission) may be luminescence based on either of the two, or luminescence based on the two.

In such a light emitting element, its organic compound layer is usually made of a thin film having a thickness below 1 $\mu$m. The light emitting element is a natural light type element, wherein the organic compound layer itself emits light. Therefore, backlight, which is used in conventional liquid crystal displays, is unnecessary. As a result, the light emitting element has a great advantage that it can be produced into a thin and light form.

The time from the injection of carries to the recombination thereof in the organic compound layer having a thickness of about 100 to 200 nm is about several tens nanoseconds in light of carrier mobility in the organic compound layer. Luminescence response time, which includes the step from the recombination of the carries to luminescence, is a time in order of microseconds or less. Therefore, the light emitting element also has an advantage that the response thereof is very rapid.

On the basis of such properties, for example, realizability of a thin and light form, rapid responsibility, and capability of being driven with a low DC voltage, attention is paid to the light emitting element as a flat panel display element in the next generation. Moreover, the light emitting element is relatively easy to watch since the light emitting element is of the natural light type and the field angle thereof is wide. Thus, it can be considered that the light emitting element is effective as an element used in a display screen of electrical appliances.

Such a light emitting element can be classified into a passive matrix type (simple matrix type) and an active matrix type, dependently on the driving manner thereof. Attention is paid particularly to the active matrix type since highly minute display based on pixels whose number is over QVGA can be realized.

A light emitting device of the active matrix type, having a light emitting element, has an element configuration as illustrated in FIG. 18. A TFT 1902 is formed on a substrate 1901, and an interlayer insulating film 1903 is formed on the TFT 1902. The interlayer insulating film 1903 can be made of an inorganic material containing silicon, such as silicon oxide or silicon nitride, or an organic material such as an organic resin material (for example, polyimide, polyamide, or polyacrylate). In order to make the surface of the substrate flat, the organic material is more suitable.

On the interlayer insulating film 1903 is formed an anode (pixel electrode) 1905 connected electrically to the TFT 1902 through an wiring 1904. As the material of the anode 1905, a transparent conductive material having a large work function is suitable. As examples thereof, there are suggested: indium tin oxide (ITO), tin oxide ($SnO_2$), an alloy made of indium oxide and zinc oxide (ZnO), a golden semipermeable membrane, polyaniline and the like. Of these, ITO is most frequently used since ITO has a band gap of about 3.75 eV and high transparency against visible light rays.

Examples of the method of forming a film of ITO include chemical vapor deposition, spray pyrolysis, vacuum evaporation, electron beam evaporation, sputtering, ion beam sputtering, ion plating, and ion assist evaporation. In recent years, sputtering has been frequently used in industry.

An organic compound layer 1906 is formed on the anode 1905. (In the specification, all layers disposed between an anode and a cathode are defined as organic compound layers.) Specifically, the organic compound layer 1906 includes one or more of a light emitting layer, a hole injection layer, an electron injection layer, a hole transport layer, an electron transport layer or the like. Basically, the light emitting element has a structure wherein an anode, a light emitting layer and a cathode are successively deposited, or may has, for example, a structure wherein an anode, a hole injection layer, a light emitting layer and a cathode are successively deposited, or a structure wherein an anode, a hole injection layer, a light emitting layer, an electron transport layer and a cathode are successively deposited.

Examples of the method of forming a film of the organic compound making into the organic compound layer 1906 include vapor deposition, printing, inkjet printing, and spin coating. The vapor deposition, which makes application-sharing (i.e., coating-sharing) possible by use of metal masks, is frequently used to make a film of a low molecular weight organic material.

After the organic compound layer 1906 is formed, a cathode 1907 is formed. In this way, a light emitting element 1908 is formed. In FIG. 18, only the light emitting element formed in one pixel is illustrated. Actually, however, a plurality of the light emitting elements are formed in a pixel section so as to form a light emitting device of an active matrix type.

For the production of a light emitting device, an improvement in its electrodes is important in order to make the device characteristic higher.

However, several problems remain about the formation of the anode. In the case of an active matrix type element configuration as described above, two problems as stated below are caused since its anode is formed to contact its interlayer insulating film.

The one is a problem caused from the fact that the temperature characteristic of the organic resin material which makes into the interlayer insulating film is different from that of the transparent conductive film (ITO) constituting the anode. Specifically, the thermal expansion coefficients, depending on temperature, of the two materials formed to contact each other are different from each other; therefore, cracks are easily generated near the interface between the two materials and inside the material having a smaller thermal expansion coefficient when heat is supplied to the two materials.

FIG. 2A shows relationship between temperature and thermal expansion coefficient. Its transverse axis is taken along temperature, and its vertical axis is taken along thermal expansion coefficient. Lines 201 and 202 represent the thermal expansion coefficient of the organic resin material (PI: polyimide) which makes into the interlayer insulating film and that of the transparent conductive film (ITO) constituting the anode, respectively. When temperature is Tx in this graph, the thermal expansion coefficient of the organic resin material (PI) is a1 and that of ITO is a2.

The following relationship is established about these thermal expansion coefficients: a1>a2. Therefore, in the case that an organic resin material 212 and an ITO 213 are formed on a substrate 211 so as to overlap with each other as illustrated in FIG. 2B, cracks 214 are generated near the interface between the organic resin material 212 and the ITO 213 and inside the ITO 213, as illustrated in FIG. 2B.

The ITO is an anode of the light emitting element, and is an electrode for injecting holes related to luminescence. Therefore, when the cracks are generated in the ITO, the generation of the holes is influenced or the holes to be injected are reduced. Moreover, the light emitting element deteriorates.

The other is a problem about gas generated from the interlayer insulating film made of the organic resin material such as polyimide, polyamide, or polyacrylate. It is known that in general a light emitting element deteriorates easily by oxygen or water. Thus, the deterioration of the light emitting element is promoted by gas, such as oxygen, generated from the interlayer insulating film.

Furthermore, there is a problem resulting from the flatness of the surface of the anode. This is a problem common to both of the passive matrix and active matrix types. If the flatness of the anode surface is poor, the thickness of the organic compound layer formed on the anode becomes uneven. When the thickness of the organic compound layer in the light emitting element is uneven in this way, an electric field is unevenly applied thereto so that electric density in the organic compound layer also becomes uneven. As a result, the brightness of the light emitting element drops, and further the life span of the light emitting element becomes short because of acceleration of the deterioration of the element.

SUMMARY OF THE INVENTION

Thus, an object of the present invention is to overcome these problems and provide a light emitting element which deteriorates more slowly than conventional elements so as to have a long life span.

Another object of the present invention is to provide a light emitting device using such a light emitting element so as to have a longer life span than conventional elements. A further object of the present invention is to provide an electrical appliance using this light emitting device so as to have a longer life span than conventional electrical appliances.

The method of the present invention for attaining the above-mentioned objects will be described hereinafter.

As shown in FIG. 1, a TFT (current-controlling TFT) 102 is formed on a substrate 101. An interlayer insulating film 103 made of an organic resin material is formed thereon. Furthermore, an insulating film 104 made of an inorganic insulating material is formed on the interlayer insulating film 103.

As the material of the insulating film, there may be used an inorganic insulating material containing silicon or aluminum, such as silicon oxide, silicon nitride (SiN), silicon oxide nitride (SiON), silicon nitride oxide (SiNO), aluminum nitride (AlN), aluminum nitride oxide (AlNO) or aluminum oxide nitride (AlON).

The purposes that the insulating film 104 is formed on the interlayer insulating film 103 are to prevent the release of gas from the interlayer insulating film 103 and to suppress the generation of cracks at portions near the interface of an anode 106 (the anode 106 being formed on the interlayer insulating film 103) and inside the anode (ITO) 106, based on a difference between the thermal expansion coefficient of the interlayer insulating film 103 and that of the anode 106.

The thermal expansion coefficient of the inorganic insulating material which makes into the insulating film 104 is as shown by a line 203 in FIG. 2A. That is, it can be understood that the thermal expansion coefficient of the inorganic insulating material is a value between that of the organic resin material (PI) 201 and that of the transparent conductive film (ITO) 202.

Specifically, at the temperature Tx, the thermal expansion coefficient of the organic resin material (PI) is a1, that of the ITO which makes into the anode is a3, and that of the insulating material is a2. The relationship among these thermal expansion coefficients is: a1>a2>a3. Therefore, if an insulating film 223 made of the inorganic insulating material is formed between an interlayer insulating film 222 and an anode 224 as illustrated in FIG. 2C, tensile force (shear stress) generated in the anode (ITO) 224 and based on difference in the thermal expansion coefficients can be relieved.

The organic resin material contains gas such as oxygen. Thus, the gas may be released from the inside of the organic resin material with the passage of time. However, by depositing the insulating film 223 made of the inorganic insulating material on the interlayer insulating film made of the organic resin material as described above, it is possible to prevent the gas from being released from the inside of the organic resin.

In this way, the light emitting element formed on the interlayer insulating film made of the organic resin material can be prevented from being deteriorated by the gas. As a result, the life span of the light emitting element can be made longer.

After the formation of the insulating film 104, contact holes are made in the interlayer insulating film 103 and the insulating film 104 and an wiring 105 with the current-controlling TFT 102 is formed. The anode 106 made of a transparent conductive material is formed to contact this wiring 105.

By forming an organic compound layer 107 and a cathode 108 on the anode 106, a light emitting element 109 composed of the anode 106, the organic compound layer 107 and the cathode 108 is formed. Thus, an active matrix type light emitting device is completed.

However, the surface of the transparent conductive film, which constitutes the anode, is rough so as to have unevenness. Therefore, in order to raise the light emitting brightness of the light emitting element 109 and make the life span thereof longer, the surface of the transparent conductive film is required to be made flat.

The flatness of the surface, that is, the surface roughness has a relationship with the contact angle thereto. When the surface has a fine uneven structure, the surface free energy per unit area varies dependently thereon. This can be explained on the basis of Wenzel's equation (equation 1):

$$\cos\theta' = \gamma(\gamma_S - \gamma_{SL})/\gamma_L = \gamma\cos\theta$$

wherein θ represents the contact angle to a flat surface; θ', the contact angle to a surface having an uneven structure; $\gamma_S$, the surface free energy of the surface of the solid; $\gamma_L$, the surface free energy of the surface of the liquid; $\gamma_{SL}$, the surface free energy of the interface between the solid and the liquid; and r. a parameter showing the ratio of the surface area of the surface having the uneven structure to that of the flat surface. Namely, it can be understood from this equation that the contact angel varies dependently on the surface area.

Specifically, if the contact angle θ' to a surface of a transparent conductive film having an uneven structure is smaller than 90°, the θ' and the contact angle θ to the surface after flattening-treatment satisfy: θ'<θ. If θ' is larger than 90°, the θ' and the contact angle θ to the surface after flattening-treatment satisfy: θ'>θ.

Thus, in the case that a light emitting device is produced in the present invention, a transparent conductive film is made and subsequently the surface thereof is washed with a washing liquid and wiped/cleaned with a polyvinyl alcohol (PVA)-based porous body, which has wiping and cleaning capability. In this way, the contact angle to the surface is changed. Surface flattening wherein the degree of this change in the contact angle is an indicator is performed.

The above description is about the process of flattening the surface of the anode produced after the formation of the wiring by wiping/cleaning the surface. In the present invention, however, it is allowable that a flattening film having a thickness of about 1 to 50 Å is formed on the surface of the anode to make the flatness high and subsequently this flattening film is wiped/cleaned in the same way.

Alternatively, it is allowable that after the formation of the wiring and before the patterning of the transparent conductive film into the anode, the film is wiped/cleaned. It is also allowable that after the anode is formed and the surface of the anode is wiped/cleaned, the wiring is formed.

After the surface of the anode 106 is wiped/cleaned, a bank 110 made of an insulating material is formed. The shape of the bank 110 can be controlled by the insulating material used in this step and etching conditions. After the formation of the bank 110, the organic compound layer 107 containing an organic compound is formed. Furthermore, the cathode 108 is formed. In the above-mentioned way, the light emitting element 109 composed of the anode 106, the organic compound layer 107, and the cathode 108 can be formed.

Incidentally, in recent years, there have been successively published light emitting elements capable of converting energy radiated when a molecule is returned from the triple exciting state thereof from the ground state thereof (referred to as the "triplet exciting energy") into luminescence, and attention has been paid to the height of the efficiency of the luminescence (Document 1: D. F. O'Brien, M. A. Baldo, M. E. Thompson and S. R. Forrest, "Improved energy transfer in electrophosphorescent devices", Applied Physics Letters, vol. 74, No. 3, 442–444 (1999); and Document 2: Tetsuo TSUTSUI, Moon-Jae YANG, Masayuki YAHIRO, Kenji NAKAMURA, Teruichi WATANABE, Taishi TSUJI, Yoshinori FUKUDA. Takeo WAKIMOTO and Satoshi MIYAGUCHI, "High Quantum Efficiency in Organic Light-Emitting Devices with Iridium-Complex as a Triplet Emissive Center", Japanese Journal of Applied Physics. Vol. 38, L1502–L1504 (1999)).

In Document 1, a metal complex wherein a central metal is platinum is used. In Document 2, a metal complex wherein a central metal is iridium is used. Light emitting elements formed using organic compounds capable of converting the triplet exciting energy of these complexes into luminescence (the light emitting elements and the organic compounds being referred to as "triplet light emitting elements" and "triplet light emitting material", respectively, hereinafter) make it possible to attain higher brightness luminescence and higher luminescence efficiency than conventional light emitting elements.

According to Document 2, however, the half-life of brightness in the case that the initial value thereof is set to 500 cd/m² is about 170 hours. Thus, there remains a problem about the life span of the light emitting element. Thus, by applying the present invention to the triplet light emitting element, a highly functional light emitting element, which attains high brightness luminescence and high luminescence efficiency and further has a long life span, can be realized.

Therefore, the present invention embraces triplet light emitting elements to which the above-mentioned concept of the present invention (i.e., an insulating film is formed on an interlayer insulating film and further the surface of an anode is made flat) is applied.

BRIEF DESCRIPTION OF THE DRAWINGS

FIGS. 4A to 4D are explanatory views of wiping/cleaning treatment of the present invention.

FIGS. 8A to 8D are explanatory views of producing-steps.

FIGS. 9A to 9C are explanatory views of producing-steps.

FIGS. 11A and 11B are explanatory views of producing-steps.

FIGS. 12A and 12B are explanatory views of a sealing configuration of a light emitting device.

PREFERRED EMBODIMENTS OF THE INVENTION

The process for producing a light emitting element of the present invention will be described hereinafter. In order to make the description thereof simple, the following will refer to only a part of a pixel section wherein light emitting elements are formed.

[Embodiment 1]

Figure 1:
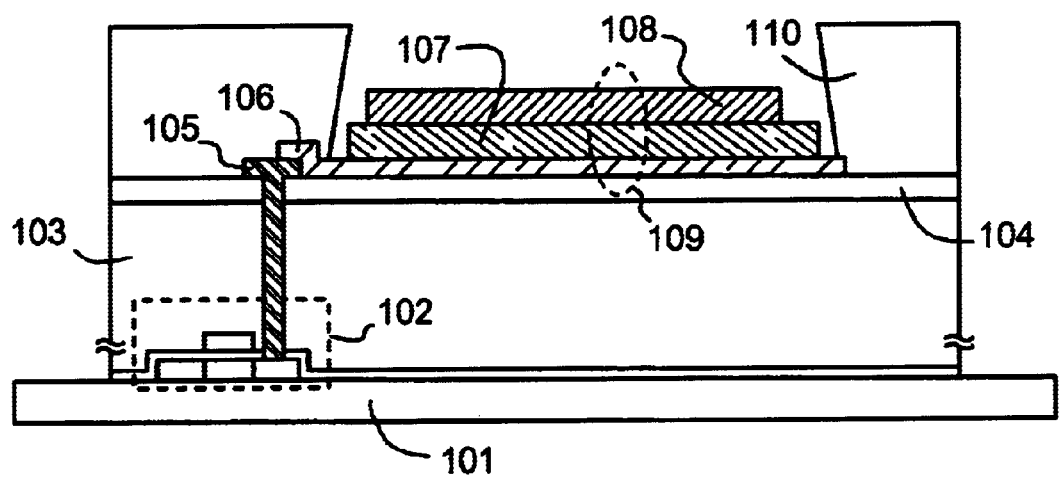
FIG. 1 is a view illustrating an element configuration in the present invention.
Figure 2A:
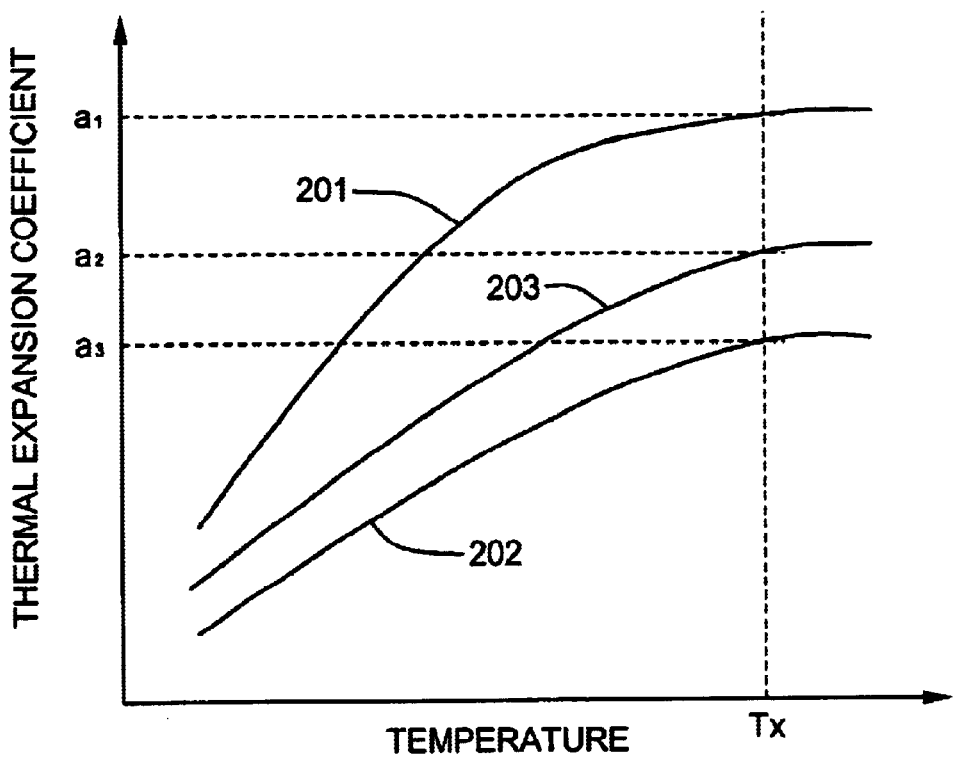
FIGS. 2A to 2C are views for explaining thermal expansion coefficients.
Figure 2B:
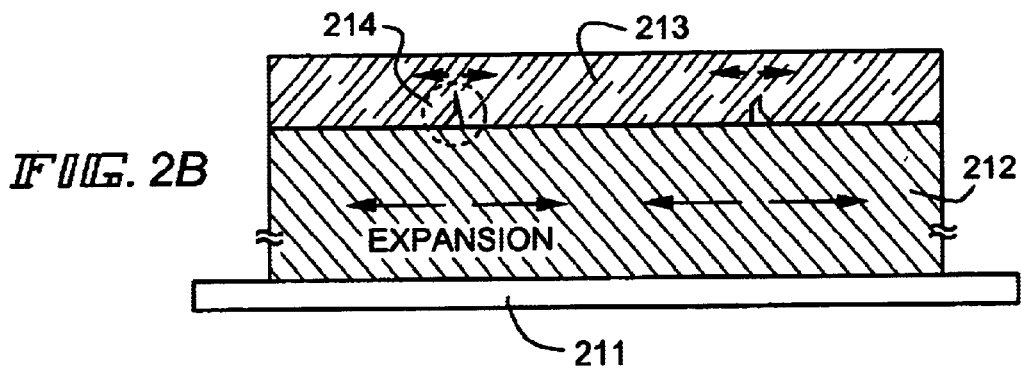
Figure 2C:
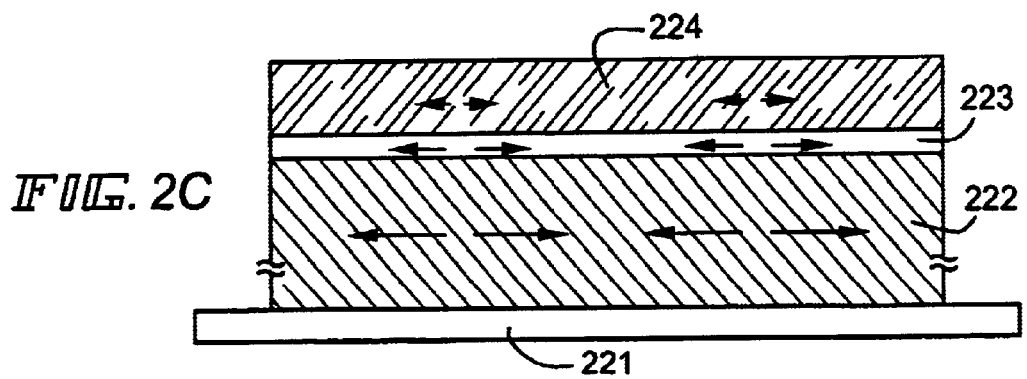
Figure 3A:
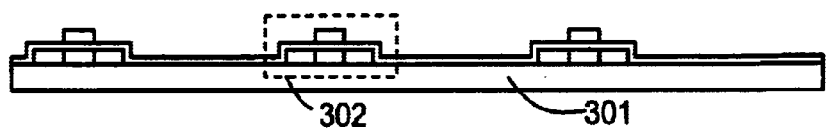
FIGS. 3A to 3F are explanatory views of a process for producing a light emitting element of the present invention.

First, TFTs 302 are formed on a substrate 301, as illustrated in FIG. 3A. The TFTs described herein are TFTs for controlling electric currents which flow light emitting elements, and are referred to as the current-controlling TFTs 302.

Figure 3B:

Next, an interlayer insulating film 303 is formed on the current-controlling TFTs 302 in order to make the surface of the substrate flat. As the material thereof, there is used, for example, an organic resin material such as polyimide, polyacrylate, polyamide, polyimideamide, or benzocyclobutene (BCB). The average film thickness of the interlayer insulating film is set to 1.0 to 2.0 $\mu$m (FIG. 3B).

Figure 3C:
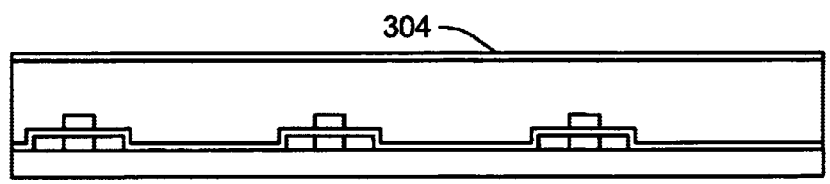

By making the interlayer insulating film 303 made of the organic resin material in this way, the surface can be satisfactorily made flat. Since the organic resin material generally has a low dielectric constant, parasitic capacity can be reduced. In order to prevent release of gas from the interlayer insulating film, an insulating film 304 is formed on the interlayer insulating film 303, as illustrated in FIG. 3C.

It is advisable that the insulating film 304 is composed of a monolayer or a laminated film made of one or more selected from inorganic insulating materials containing silicon or aluminum, such as silicon oxide, silicon nitride (SiN), silicon oxide nitride (SiON), silicon nitride oxide (SiNO), aluminum nitride (AlN), aluminum nitride oxide (AlNO) and aluminum oxide nitride (AlON). In all cases, the insulating film 304 is made of an inorganic material. The film thickness of the insulating film 304 is set to 100 to 200 nm. The insulating film 304 can be formed by plasma CVD causing electric discharge under the following conditions: reaction pressure: 20 to 200 Pa, substrate temperature: 300 to 400° C., and high frequency (13.56 MHz) power density: 0.1 to 1.0 W/cm².

Thereafter, a resist mask having a given pattern is formed, and contact holes reaching drain regions of the respective current-controlling TFTs 302 are made. The contact holes can be made by etching the insulating film 304 and then etching the interlayer insulating film 303 made of the organic resin material.

Figure 3D:
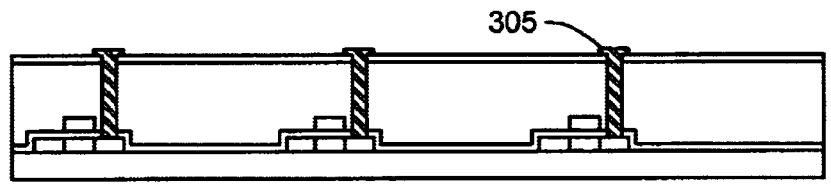

An electrically conductive metal film is formed by sputtering or vacuum evaporation. The metal film is patterned using a mask, and is subsequently etched to form wirings 305 (FIG. 3D). As the material of the wirings, Al, Ti, or an alloy made of Al and Ti may be used.

Figure 3E:
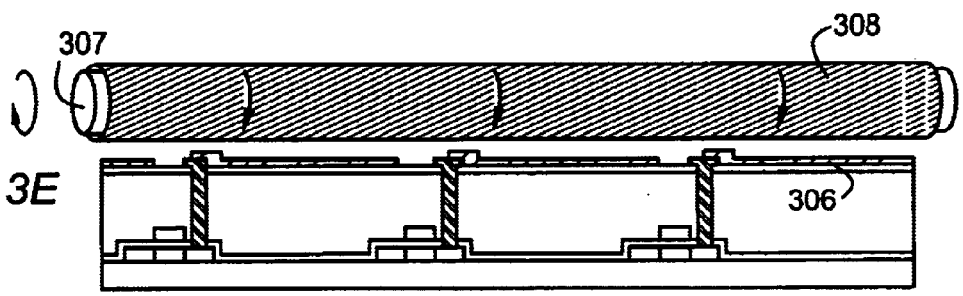

Next, a transparent conductive film is formed thereon, and this film is patterned to form anodes 306 constituting pixel electrodes (FIG. 3E). As the transparent electrode, there may be used a transparent conductive film wherein indium tin oxide (ITO) or indium oxide is mixed with 2 to 20% of zinc oxide (ZnO).

After the anodes 306 are formed, heating treatment is conducted. Heating at 230 to 350° C. is performed to crystallize the transparent conductive film constituting the anodes.

Next, the surfaces of the anodes 306 are subjected to the flattening treatment of the present invention. This treatment is conducted by wiping/cleaning the surfaces of the anodes 306 with a polyvinyl alcohol (PVA)-based porous body 308.

Since the contact angle $\theta_1$ to the surface of the transparent conductive film in the present embodiment 1 is smaller than 90°, the relationship between the $\theta_2$ to the surface after the wiping/cleaning treatment and the above-mentioned the $\theta_1$ is made into the following: $\theta_1 < \theta_2$.

One of the methods for wiping/cleaning with the PVA-based porous body 308 is a method of winding the PVA-based porous body 308 around an axis 307, bringing this into contact with the surfaces of the anodes 306 and rotating the axis 307. In the present invention, however, it is sufficient that the anode surfaces are wiped/cleaned and made flat by frictional force generated between the PVA-based porous body 308 and the anode surfaces. Thus, the wiping/cleaning method in the present invention is not limited to the above-mentioned method.

When the PVA-based porous body 308 is wiped/cleaned, a cleaning liquid is used. Examples of the washing liquid used at this time include pure water; neutral detergents such as alkylbenzene sulfonates, which are made from higher alcohols or alkylbenzenes; aqueous solutions containing slightly acidic and slightly basic chemical agents; polar solvents such as ethanol, methanol, toluene, and acetone; and nonpolar solvents such as benzene and carbon tetrachloride.

The speed of the treatment and the flatness of the surface are adjusted by the rotation number of the axis 307 and the pushing value of the axis. The pushing value used in the present specification is a value representing the distance of the axis moved in the substrate direction when the surfaces of the anodes are wiped/cleaned. In this case, the direction perpendicular to the substrate is defined as a Y direction, the position of the axis when the PVA-based porous body 308 contacts the surfaces to be treated is defined as a reference value (Y=0), and the direction along which the PVA-based porous body is pushed against the substrate is defined as a positive direction. In the present invention, the rotation number of the axis 307 is desirably set to 100 to 300 rpm, and the pushing value is desirably set to 0.1 to 1.0 mm.

Figure 3F:
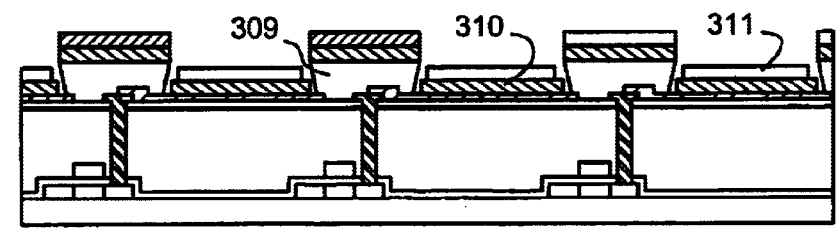

After the surfaces of the anodes 306 are made flat as described above, banks 309, an organic compound layer 310 and cathodes 311 are formed as illustrated in FIG. 3(F).

The banks 309 are formed to be embedded in gaps between the anodes. An organic material such as an organic resin is used as the material of the banks 309 to form a film, and subsequently the film is etched in such a manner that the banks 309 have desired shapes. In the present embodiment, the organic compound layer 310 is formed by combining and laminating plural layers, such as a hole injection layer, a hole transport layer, a hole barrier layer, an electron transport layer, an electron injection layer and a buffer layer, besides the light emitting layer. It is advisable that the film thickness of the organic compound layer 310 is set to 10 to 400 nm.

After the organic compound layer 310 is formed the cathodes 311 are formed by vapor deposition (evaporation).

As a conductive film constituting the cathodes 311, there may be used a MgAg film, an Al—Li alloy film, or a film formed by co-evaporation of an element belonging to the 1 or 2 group in the periodic table and aluminum. It is advisable that the film thickness of the cathodes 311 is set to 80 to 200 nm. As described above, a light emitting element of the present invention can be produced.

As the present embodiment, the process wherein the anodes 306 are wiped/cleaned and subsequently the banks 309 are formed has been described. It is however allowable that the banks are formed and subsequently the surfaces of the anodes are wiped/cleaned. If this method is used, there arises a problem that the organic material (for example, the organic resin) formed on the uneven surfaces of the anodes is not easily etched on the surfaces of the anodes when the banks are patterned.

[Embodiment 2]

The timing when the flattening treatment in the present invention is conducted is not limited to the time after the anodes are formed as described in the Embodiment 1. Thus, the flattening treatment may be conducted after the formation of the transparent conductive film (and before the patterning of the anodes).

Referring to FIGS. 5A to 5F, therefore, the following will describe a process for producing light emitting elements in a way different from the way described in the Embodiment 1.

Figure 5A:
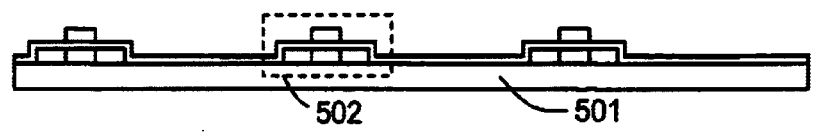
FIGS. 5A to 5F are explanatory views of a process for producing a light emitting element of the present invention.
Figure 5B:
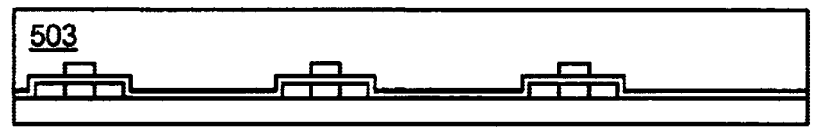
Figure 5C:
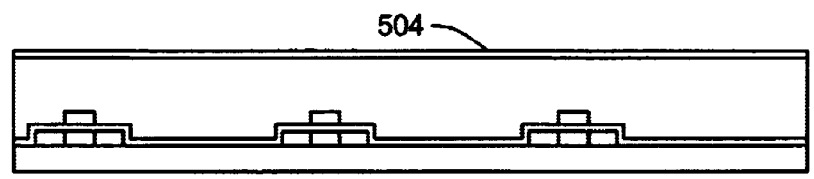

The same way as described in the Embodiment 1 is used about the way of forming current-controlling TFTs 502 on a substrate 501, forming an interlayer insulating film 503 and an insulating film 504, making contact holes in the insulating film 504 and the interlayer insulating film 503, and forming wirings 505 connected electrically to the current-controlling TFTs 502 (FIGS. 5A–5C).

Figure 5D:

After the formation of the wirings 505, a transparent conductive film 506 is formed to have a thickness of 80 to 200 nm, as illustrated in FIG. 5D. As the material of the transparent conductive film 506, there may be used an indium tin oxide (ITO), or a mixture material of indium oxide and zinc oxide (ZnO).

After the formation of the transparent conductive film 506, the flattening treatment of the present invention is conducted. In the step of this treatment the surface of the transparent conductive film 506 is wiped/cleaned with a polyvinyl alcohol (PVA)-porous body so as to be flattened.

The manner of wiping/cleaning the surface with the PVA-based porous body may be the same manner as described in the Embodiment 1. That is, an axis 507 around which the PVA-based porous body 508 is wound is rotated so that the surface of the transparent conductive film 506 is flattened by frictional force generated when the PVA-based porous body 508 contacts the surface of the transparent conductive film 506.

At the time of the wiping/cleaning treatment, a washing liquid is used. Examples of the washing liquid which can be used at this time include pure water; neutral detergents such as alkylbenzene sulfonates, which are made from higher alcohols or alkylbenzenes; aqueous solutions containing slightly acidic and slightly basic chemical agents; polar solvents such as ethanol, methanol, acetone and toluene; and nonpolar solvents such as benzene and carbon tetrachloride. In the present embodiment, it is desired to use pure water or a neutral detergent as the washing liquid.

The rotation number of the axis 507 and the pushing value are desirably set to 100 to 300 rpm and 0.1 to 1.0 mm, respectively.

Figure 5E:
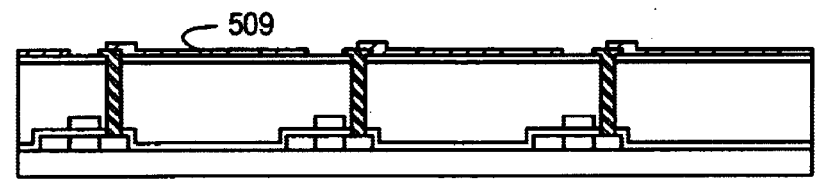
Figure 5F:
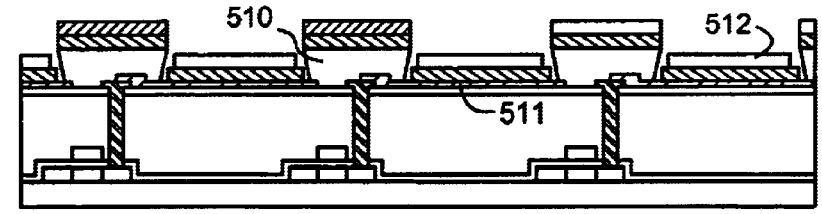

After the surface of the transparent conductive film 506 is flattened, anodes 509 are formed by patterning, as illustrated in FIG. 5E. After the formation of the anodes 509, heating treatment is conducted at 230 to 350° C. to crystallize the transparent conductive film constituting the anodes. Thereafter, banks 510, an organic compound layer 511 and cathodes 512 are formed. The formation of the banks 510, the organic compound layer 511 and the cathodes 512 may be performed in the same way as in the Embodiment 1.

As described above, a light emitting device having the light emitting elements of the present invention can be produced.

[Embodiment 3]

As the present embodiment 3, the following will describe a way of forming a flattening film made of an organic resin material on the surfaces of anodes so as to make unevenness of the anode surfaces small, and then wiping/cleaning the anode surfaces with a PVA-based porous body so as to be flattened.

The same way as described as in the Embodiment 1 is used about the way of forming current-controlling TFTs 602 on a substrate 601, forming an interlayer insulating film 603 and an insulating film 604, making contact holes in the insulating film 604 and the interlayer insulating film 603, and forming wirings 605 connected electrically to the current-controlling TFTs 602.

After the formation of the wirings 605, a transparent conductive film 606 is formed to have a thickness of 80 to 120 nm. As the material of the transparent conductive film 606, there may be used an indium tin oxide (ITO), or a mixture material of indium oxide and zinc oxide (ZnO).

Figure 6A:
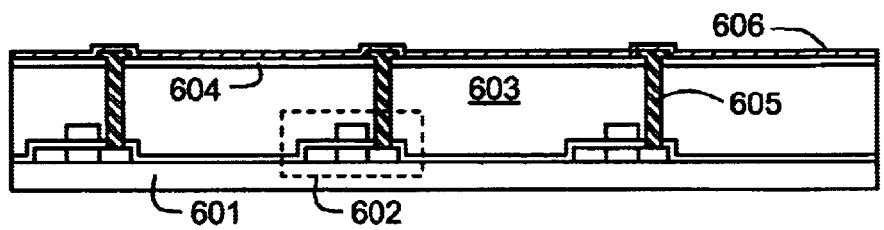
FIGS. 6A to 6E are explanatory views of a process for producing a light emitting element of the present invention.
Figure 6B:
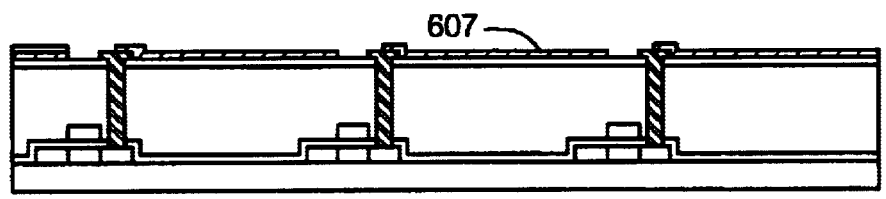
Figure 6C:
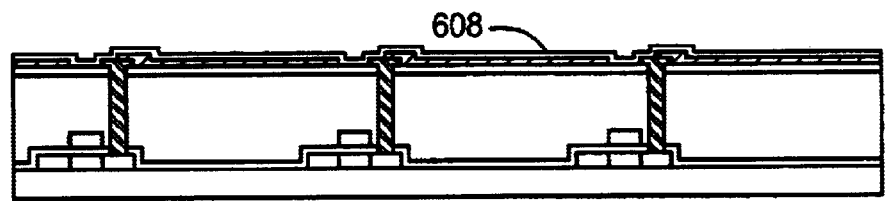

In the present embodiment 3, after the formation of the transparent conductive film 606, this film is patterned to form anodes 607. After the formation of the anodes 607, heating treatment is conducted at 230 to 350° C. to crystallize the transparent conductive film constituting the anodes 607 (FIG. 6B). Thereafter, a flattening film 608 is formed (FIG. 6C).

Figure 6D:
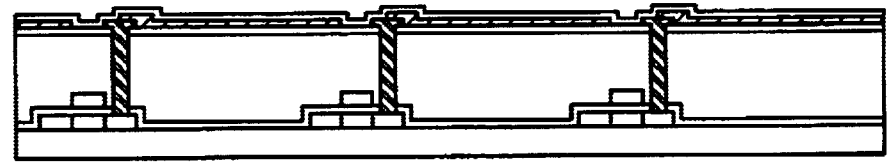

Next, the flattening treatment of the present invention is conducted. In this treatment, the surface of the flattening film 608 is wiped/cleaned with a polyvinyl alcohol (PVA)-porous body so as to be flattened (FIG. 6D).

The manner of wiping/cleaning the surface with the PVA-based porous body may be the same manner as described in the Embodiment 1. That is, an axis 609 around which the PVA-based porous body 610 is wound is rotated so that the surface of the flattening film 608 is wiped/cleaned and flattened by frictional force generated when the PVA-based porous body 610 contacts the surface of the flattening film 608.

At the time of the wiping/cleaning treatment with the PVA-based porous body, a washing liquid is used. Examples of the washing liquid which can be used at this time include pure water; neutral detergents such as alkyl sulfonates, which are made from higher alcohols or alkylbenzenes; aqueous solutions containing slightly acidic and slightly basic chemical agents; polar solvents such as ethanol, methanol, acetone and toluene; and nonpolar solvents such as benzene and carbon tetrachloride. In the present embodiment, it is desired to use a polar solvent or a nonpolar solvent as the washing liquid.

The rotation number of the axis 507 and the pushing value are desirably set to 100 to 300 rpm and 0.1 to 1.0 mm, respectively.

Figure 6E:
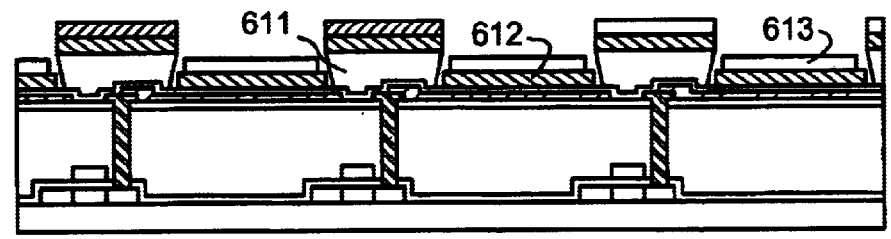

After the surface of the flattening film 608 is flattened, banks 611, an organic compound layer 612 and cathodes 613 are formed as illustrated in FIG. 6E. The formation of the banks 611, the organic compound layer 612 and the cathodes 613 may be performed in the same way as in the Embodiment 1.

As described above, a light emitting device having the light emitting elements of the present invention can be produced. By carrying out the present embodiment 3, the unevenness of the anode surfaces is made flat to some degree with the organic resin material having high flatness and subsequently the flattening treatment is performed using the PVA-porous body. In this case, therefore, the period for the flattening treatment can be made shorter than in the case of flattening the anode surfaces directly. As a result, the present embodiment is effective for an improvement in throughput in the light emitting device producing process.

As described above, according to the production of the light emitting device having the light emitting elements using the present invention, gas can be prevented from being released from the organic resin material constituting the interlayer insulating film by means of the insulating film formed in the interface between the interlayer insulating film and the anodes. Furthermore, this insulating film makes it possible to make the difference between the thermal expansion coefficient of the interlayer insulating film and that of the anodes small. Therefore, cracks can be prevented from being generated near the interface between the interlayer insulating film and the anodes.

Furthermore, by wiping/cleaning the anode surfaces with the PVA-based porous body so as to be flattened, the brightness characteristics of the light emitting elements can be improved and the driving voltage for the elements can be made low. Additionally, the life span of the elements can be made long.

EXAMPLES

Example 1

As the present example, the following will describe light emitting elements produced by the production process described in the Embodiment 1, referring to FIG. 3.

First, current-controlling TFTs 302 are formed on a substrate 301, as illustrated in FIG. 3A. As the substrate, glass is used. The way of forming TFTs, examples of which include the current-controlling TFTs formed on the substrate, will be specifically described in Example 3.

Next, an interlayer insulating film 303 is formed on the current-controlling TFTs 302. In the present example, polyimide is used as the material thereof and the average film thickness thereof is set to 1.0 to 2.0 µm (FIG. 3B).

Next, an insulating film 304 is formed on the interlayer insulating film 303. In the present example, as the inorganic insulating material of the insulating film, silicon oxide nitride is used. The film thickness is set to 100 to 200 nm.

In the present example, the insulating film is formed by plasma CVD using $SiH_4$, $NH_3$ and $N_2O$ as reaction gases in electric discharge under the following conditions: reaction pressure: 20 to 200 Pa, substrate temperature: 300 to 400° C., and high frequency (13.56 MHz) power density: 0.1 to 1.0 W/cm$^2$.

Thereafter, a resist mask having a given pattern is formed, and contact holes reaching drain regions of the respective current-controlling TFTs 302 are made. The contact holes are made by dry etching. In this case, the contact holes are made by etching the insulating film 304, using a mixture gas of $CF_4$ and $O_2$ as an etching gas and then etching the interlayer insulating film 303 made of the organic resin material, using a mixture gas of $CF_4$, $O_2$ and He.

A conductive metal film is formed by sputtering or vacuum evaporation, patterned with a mask, and etched to form wirings 305 (FIG. 3D). In the present example, Al is used as the material of the wirings.

Next, a transparent conductive film is formed thereon to have a thickness of 80 to 120 nm, and is then patterned to form anodes 306 constituting pixel electrodes (FIG. 3E). As the material of the transparent conductive film, indium tin oxide (ITO) is used.

After the formation of the anodes 306, heating treatment is conducted. In the present example, the heating treatment is conducted at 230 to 350° C. to crystallize ITO constituting the anodes. After the heating treatment, the surfaces of the anodes are subjected to flattening treatment. In the step of this treatment, a polyvinyl alcohol (PVA)-based porous body, specifically Bellclean (made by Ozu Corp.) is used to wipe/clean the surfaces of the anodes 306, thereby flattening the surfaces of the anodes 306.

In the step of wiping/cleaning with the Bellclean 308 in the present invention, the Bellclean 308 is wound around an axis as illustrated in FIG. 4A and this is brought into contact with the surfaces of the anodes 306. The axis 307 is then rotated, whereby the surfaces of the anodes 306 can be made flat as illustrated in FIG. 4B by frictional force generated between the surfaces of the anodes 306 and the Bellclean 308.

FIG. 4C shows a contact angle $\theta_1$ to the surface of the anode before the flattening treatment, as illustrated in FIG. 4A. FIG. 4D shows a contact angle $\theta_2$ to the surface of the anode after the flattening treatment, as illustrated in FIG. 4B. In the present example, the contact angle $\theta_1$ is smaller than 90°. Therefore, the following relationship is formed between these contact angles: $\theta_1 < \theta_2$.

Figure 15:
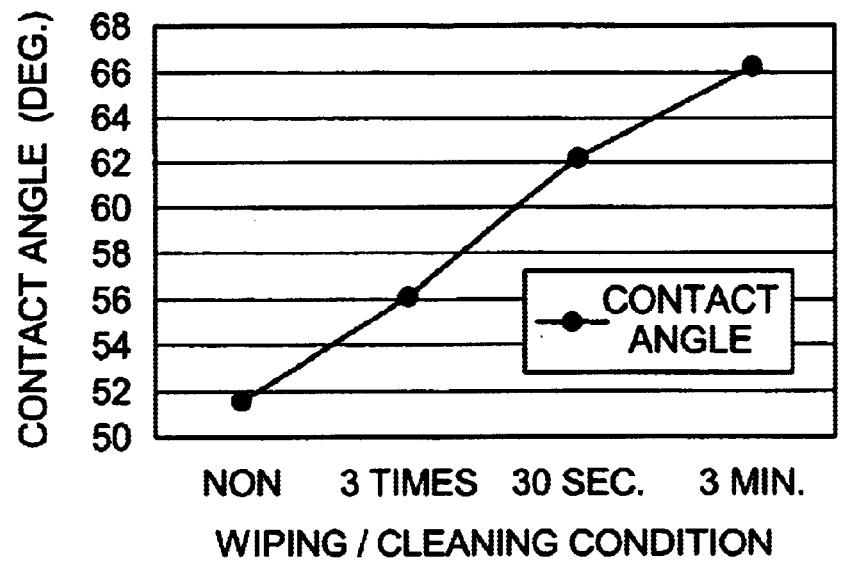
FIG. 15 is a graph showing measurement results of contact angles.

FIG. 15 shows measurement results of the contact angles before and after the flattening treatment wherein the surface of the transparent conductive film formed on the glass substrate was wiped/cleaned with the Bellclean. The results demonstrate that the contact angle to the surface of the transparent conductive film becomes larger by the wiping/cleaning treatment.

At the time of the wiping/cleaning treatment with the Bellclean 308, a washing liquid is used. In the present example, however, pure water is used. In the present example, the rotation number of the axis 307 and the pushing value are set to 100 to 300 rpm and 0.1 to 1.0 mm, respectively.

After the surfaces of the anodes 306 are flattened, banks 309, an organic compound layer 310 and cathodes 311 are formed as illustrated in FIG. 3F.

The banks 309 are formed to be embedded in gaps between the anodes. An organic material such as an organic resin is used as the material of the banks to form a film. Thereafter, the film is etched to have a desired shape. In the present example, the organic compound layer 310 has a laminated configuration wherein the following are successively formed: a hole injection layer made of copper phthalocyanine (abbreviated to CuPc hereinafter) and having a film thickness of 20 nm; a hole transport layer made of 4,4'-bis[N-(1-naphthyl)-N-phenyl-amino]-biphenyl (abbreviated to α-NPD hereinafter) and having a film thickness of 20 nm; a light emitting layer made by co-evaporation of 4,4'-dicarbazole-biphenyl (abbreviated to CBP hereinafter) and tris(2-phenylpyridine)indium (abbreviated to Ir(ppy)$_3$ hereinafter) and having a film thickness of 20 nm; a hole barrier layer made of basocuprone (abbreviated to BCP hereinafter) and having a film thickness of 10 nm; and an electron transport layer made of tris(8-quinolinolate) aluminum (abbreviated to Alq$_3$ hereinafter) and having a film thickness of 40 nm.

After the formation of the organic compound layer 310, the cathodes 311 are formed by co-evaporation. As the conductive film constituting the cathodes 311, there may be used an alloy film such as an alloy film made of magnesium and silver or an alloy film made of Al and Li, or a film made by co-evaporation of an element belonging to the 1 or 2 group in the periodic table and aluminum. It is advisable that the film thickness of the cathodes 311 is set to 80 to 200 nm (typically, 100 to 150 nm).

In the above-mentioned manner, the light emitting elements of the present invention can be formed.

Example 2

As the present example, the following will describe light emitting elements produced by the production process described in the Embodiment 3, referring to FIG. 6.

In the present example, polyimide is used as an organic resin material to form a flattening film 608 having a film thickness of 50 nm on the surfaces of anodes (FIG. 6C).

After the formation of the flattening film 608, Bellclean (made by Ozu Corp.) is used to wipe/clean the surface of the flattening film 608, thereby flattening the surface (FIG. 6D).

Figure 7A:
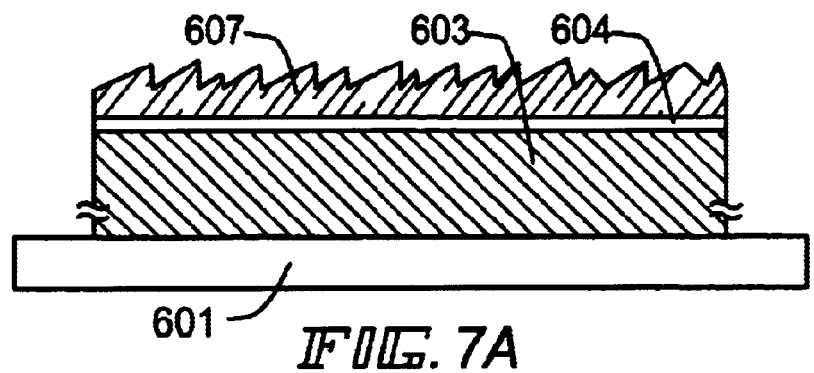
FIGS. 7A to 7C are explanatory views of wiping/cleaning treatment of the present invention.
Figure 7B:
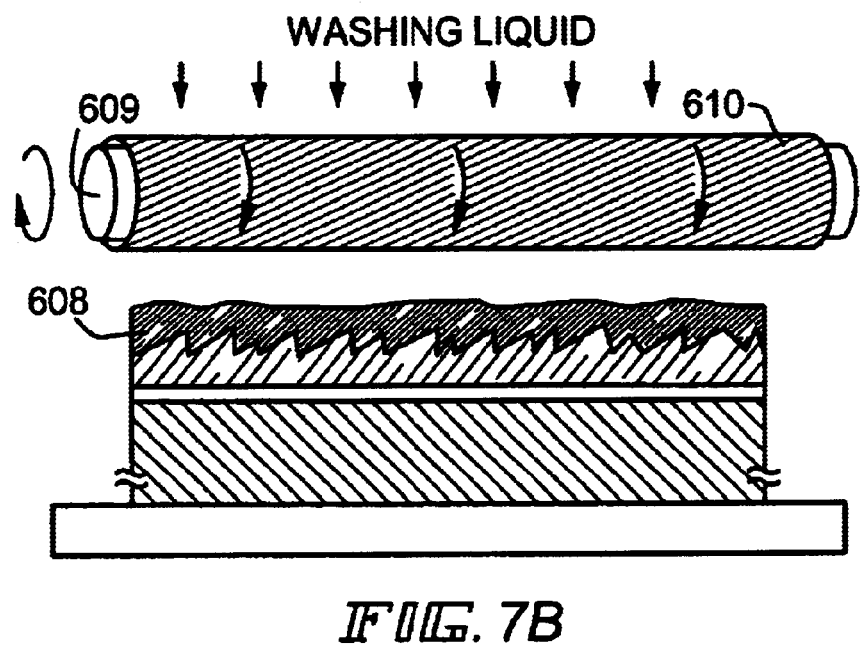
Figure 7C:
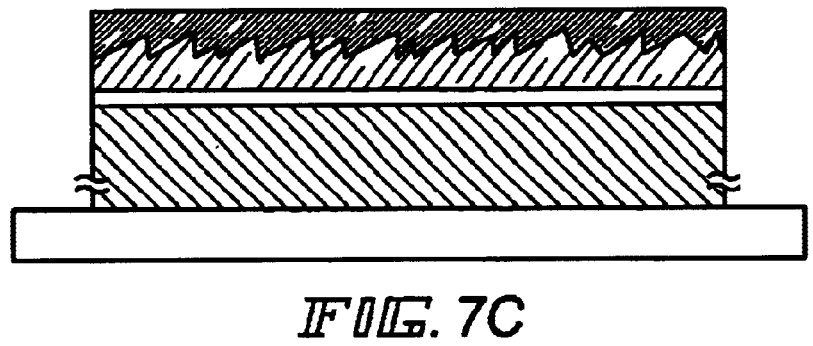

This step will be specifically described, referring to FIGS. 7A to 7C. Reference numbers used in FIGS. 7A to 7C are the same as in FIGS. 6A to 6E. The surfaces of the anodes 607 formed on the insulating film 604 have an uneven form as illustrated in FIG. 7A.

However, an organic resin material having flattening ability is applied thereto, so as to form the flattening film 608. In this way, the flatness of the surface can be increased as illustrated in FIG. 7B. By wiping/cleaning the surface whose flatness is increased by the flattening film with the Bellclean, the surface can be made flatter.

The way of wiping/cleaning with the Bellclean may be the same way as described in the Embodiment 3. That is, an axis 609 around which the Bellclean 610 is wound is rotated to wipe/clean and flatten the surface of the flattening film 608 by frictional force generated when the Bellclean 610 contacts the surface of the flattening film 608.

At the time of the wiping/cleaning treatment with the Bellclean in the present example, ethanol or methanol is used as a washing liquid. The rotation number of the axis 507 and the pushing value are set to 100 to 300 rpm and 0.1 to 1.0 mm, respectively.

After the surface of the flattening film 608 is flattened, banks 611, an organic compound layer 612 and cathodes 613 are formed. The formation of the banks 611, the organic compound layer 612 and the cathodes 613 may be performed in the same way as in Example 1.

Example 3

The light emitting device of the present invention can be produced by a process wherein the order of the steps in the production process described in the Example 1 is changed. That is, the following steps can be successively performed: the steps of forming an interlayer insulating film and an insulating film, forming anodes before the formation of wirings to current-controlling TFTs, flattening the anodes, making contact holes in the insulating film and the interlayer insulating film, and forming the wirings. In this case, adhesion between the anodes and the wirings can be improved since the wirings are formed on the flattened anode surfaces.

Example 4

In this example, the light emitting element formed by using the present invention. Described here is an example of a method of manufacturing, at the same time on the same substrate, a pixel portion having a light emitting element of the present invention and TFTs (an n-channel TFT and a p-channel TFT) for a driving circuit that is provided in the periphery of the pixel portion. The description will be given with reference to FIGS. 8A to 10C.

First, this example uses a substrate 900 made of barium borosilicate glass, typically Corning #7059 glass and #1737 glass (products of Corning Incorporated), or alumino borosilicate glass. No limitation is put to the material of the substrate 900 as long as it is light-transmissive, and a quartz substrate may be used. A plastic substrate may also be used if it can withstand heat at the process temperature of this example.

Next, as shown in FIG. 5A, a base film 901 is formed on the substrate 900 from an insulating film such as a silicon oxide film, a silicon nitride film, and a silicon oxynitride film. In this example, the base film 901 has a two-layer structure but it may be a single layer or a laminate of the above insulating films. The first layer of the base film 901 is a silicon oxynitride film 901a formed by plasma CVD using as reaction gas $SiH_4$, $NH_3$, and $N_2O$ to have a thickness of 10 to 200 nm (preferably 50 to 100 nm). In this example, the silicon oxynitride film 901a (composition ratio: Si=32%, O=27%, N=24%, H=17%) is 50 nm in thickness. The second layer of the base film 901 is a silicon oxynitride film 901b formed by plasma CVD using as reaction gas $SiH_4$ and $N_2O$ to have a thickness of 50 to 200 nm (preferably 100 to 150 nm). In this example, the silicon oxynitride film 901b (composition ratio: Si=32%, O=59%, N=7%, H=2%) is 100 nm in thickness.

On the base film 901, semiconductor layers 902 to 905 are formed. The semiconductor layers 902 to 905 are formed by patterning into a desired shape a crystalline semiconductor film that is obtained by forming a semiconductor film with an amorphous structure through a known method (sputtering, LPCVD, or plasma CVD) and then by subjecting the amorphous film to a known crystallization treatment (laser crystallization, thermal crystallization, or thermal crystallization using nickel or other catalyst). The semiconductor layers 902 to 905 are each 25 to 80 nm in thickness (preferably 30 to 60 nm). Although the material of the crystalline semiconductor film is not limited, silicon, silicon germanium ($Si_xGe_{1-x}$ (X=0.0001 to 0.02)) alloy or the like is preferred. In this example, an amorphous silicon film with a thickness of 55 nm is formed by plasma CVD and then a solution containing nickel is held to the top face of the amorphous silicon film. The amorphous silicon film is dehydrated (at 500° C. for an hour), then subjected to thermal crystallization (at 550° C. for four hours), and then subjected to laser annealing treatment for improving crystallinity, thereby obtaining the crystalline silicon film. The crystalline silicon film receives patterning treatment by photolithography to form the semiconductor layers 902 to 905.

After the semiconductor layers 902 to 905 are formed, the semiconductor layers 902 to 905 may be doped with a minute amount of impurity element (boron or phosphorus) in order to control the threshold of the TFTs.

If laser crystallization is used to form the crystalline semiconductor film, a pulse oscillation type or continuous wave type excimer layer, YAG laser, or $YVO_4$ laser may be used. When using these lasers, it is appropriate to use an optical system to collect laser light emitted from the laser oscillator into a linear beam before irradiating the semiconductor film. Although conditions of crystallization can be chosen suitably by an operator, preferred conditions are as follows. When an excimer laser is used, the pulse oscillation frequency is set to 300 Hz and the laser energy density is set to 100 to 400 mJ/cm$^2$ (typically, 200 to 300 mJ/cm$^2$). When a YAG laser is employed, the second harmonic thereof is used, the pulse oscillation frequency is set to 30 to 300 Hz, and the laser energy density is set to 300 to 600 mJ/cm$^2$ (typically, 350 to 500 mJ/cm$^2$). The laser light collected into a linear shape is 100 to 1000 $\mu$m in width, 400 $\mu$m, for example, and the entire surface of the substrate is irradiated with the beam. The overlapping ratio of the linear laser light during irradiation is set to 50 to 90%.

Next, a gate insulating film 906 is formed to cover the semiconductor layers 902 to 905. The gate insulating film 906 is an insulating film containing silicon and formed by plasma CVD or sputtering to have a thickness of 40 to 150 nm. In this example, a silicon oxynitride film (composition ratio: Si=32%, O=59%, N=7%, H=2%) with a thickness of 110 nm is formed by plasma CVD. The gate insulating film is not limited to the silicon oxynitride film, of course, and may be a single layer or a laminate of other insulating films containing silicon.

When a silicon oxide film is used, plasma CVD is employed in which electric discharge is made using a mixture of TEOS (tetraethyl orthosilicate) and O$_2$ and setting the reaction pressure to 40 Pa, the substrate temperature to 300 to 400° C., and the high frequency (13.56 MHz) power density to 0.5 to 0.8 W/cm$^2$. The thus formed silicon oxide film can provide excellent characteristics as a gate insulating film if it receives subsequent thermal annealing at 400 to 500° C.

On the gate insulating film 906, a heat resistant conductive layer 907 for forming gate electrodes is formed to have a thickness of 200 to 400 nm (preferably 250 to 350 nm). The heat resistant conductive film 907 may be a single layer or may take a laminate structure having a plurality of layers, such as a two-layer structure or a three-layer structure, if necessary. The heat resistant conductive layer contains an element selected from the group consisting of Ta, Ti, and W, or an alloy having the above elements as its ingredient, or an alloy film having the above elements in combination. The heat resistant conductive layer is formed by sputtering or CVD. In order to lower the resistance, the concentration of impurities contained in the layer is preferably reduced. The oxygen concentration in particular, is preferably 30 ppm or less. In this example, a W film with a thickness of 300 nm is formed. The W film may be formed by sputtering with W as the target, or by thermal CVD using tungsten hexafluoride (WF$_6$). Either way, the W film has to be low in resistance to use it as gate electrodes, and the resistivity of the W film is preferably set to 20 $\mu\Omega$cm or lower. The resistivity of the W film can be reduced by increasing the crystal grain size but, if there are too many impurity elements such as oxygen in the W film, crystallization is inhibited to raise the resistivity. Accordingly, when the W film is formed by sputtering, a W target with a purity of 99.9999% is used and a great care is taken not to allow impurities in the air to mix in the W film during formation. As a result, the W film can have a resistivity of 9 to 20 $\mu\Omega$cm.

The heat resistant conductive layer 907 may instead be a Ta film, which similarly can be formed by sputtering. Ar is used as sputtering gas when forming a Ta film. If an appropriate amount of Xe or Kr is added to the sputtering gas, the internal stress of the film to be formed is eased and thus the film is prevented from peeling off. The resistivity of a Ta film in α phase is about 20 $\mu\Omega$cm and is usable for a gate electrode. On the other hand, the resistivity of a Ta film in β phase is about 180 $\mu\Omega$cm and is not suitable for a gate electrode. A Ta film in α phase can readily be obtained by forming a TaN film as a base of a Ta film because a TaN film has a crystal structure approximate to that of the α phase Ta film. Although not shown in the drawings, it is effective to form a silicon film doped with phosphorus (P) to have a thickness of about 2 to 20 nm under the heat resistant conductive layer 907. This improves adhesion to the conductive film formed thereon and prevents oxidation of the conductive film and, at the same time, prevents alkaline metal elements contained in a minute amount in the hat resistant conductive layer 907 from diffusing into the first shape gate insulating film 906. In either case, the resistivity of the heat resistant conductive layer 907 is preferably set to 10 to 50 $\mu\Omega$cm.

Next, resist masks 908 are formed using the photolithography technique. Then first etching treatment is conducted. In this example, an ICP etching device is employed, CF$_4$ and Cl$_2$ are mixed as etching gas, and an RF (13.56 MHz) power of 3.2 W/cm$^2$ is given at a pressure of 1 Pa to generate plasma. The substrate side (sample stage) also receives an RF (13.56 MHz) power of 224 mW/cm$^2$ so that a substantially negative self-bias voltage is applied. Under these conditions, the etching rate of the W film is about 100 nm/min. On the basis of this etching rate, the time necessary to etch the W film is estimated. The estimated time is extended by 20% and this is the etching time for the first etching treatment.

Through the first etching treatment, conductive layers 909 to 912 having a first taper shape are formed. The angle of the tapered portions of the conductive layers 909 to 912 is 15 to 30°. In order to etch the conductive films without leaving any residue, over-etching is employed in which the etching time is prolonged by about 10 to 20%. The selective ratio of the W film to the silicon oxynitride film (the gate insulating film 906) is 2 to 4 (typically 3), and therefore a region where the silicon oxynitride film is exposed is etched by about 20 to 50 nm by the over-etching treatment (FIG. 5B).

First doping treatment is conducted next to dope the semiconductor layers with an impurity element of one conductivity type. An impurity element giving the n type conductivity is used in this doping step. The masks 908 that have been used to form the first shape conductive layers are left as they are, and the semiconductor layers are doped with an impurity element giving the n type conductivity by ion doping in a self-aligning manner while using the fist taper shape conductive layers 909 to 912 as masks. In the doping, the dose is set to $1\times10^{13}$ to $5\times10^{14}$ atoms/cm$^2$ and the acceleration voltage is set to 80 to 160 keV in order that the impurity element giving the n type conductivity reaches the semiconductor layers below the tapered portions at the edges of the gate electrodes and below the gate insulating film 906 through the tapered portions and the gate insulating film. Used as the impurity element that gives the n type conductivity is an element belonging to Group 15, typically, phosphorus (P) or arsenic (As). Here, phosphorus (P) is used. Through this ion doping, first impurity regions 914 to 917 are formed to contain the impurity element that gives the n type conductivity in a concentration of $1\times10^{20}$ to $1\times10^{21}$ atoms/cm$^3$ (FIG. 5C).

In this step, depending on the doping condition, the impurity may reach under the first shape conductive layers 909 to 912 so that the first impurity regions 914 to 917 overlap the first shape conductive layers 909 to 912.

Next, second etching treatment is conducted as shown in FIG. 8D. The second etching treatment also uses the ICP etching device to etch at an RF power of 3.2 W/cm$^2$ (13.56 MHz), a bias power of 45 mW/cm$^2$ (13.56 MHz), and a pressure of 1.0 Pa, while using a mixture gas of CF$_4$ and Cl$_2$ as etching gas. Under these conditions, conductive layers 918 to 921 having a second shape are formed. The conductive layers 918 to 921 have tapered portions at the edges and the thickness of the layers is gradually increased from the edges toward the inside. The bias power applied to the substrate side in the second etching treatment is lower than in the first etching treatment and the ratio of isotropic etching is increased that much, thereby setting the angle of the tapered portions to 30 to 60°. The masks 908 are etched to lose the edges and become masks 922. In the step of FIG. 8D, the surface of the gate insulating film 906 is etched by about 40 nm.

Then the semiconductor layers are doped with an impurity element that gives the n type conductivity in a dose smaller than in the first doping treatment and at a high acceleration voltage. For example, the acceleration voltage is set to 70 to 120 keV and the dose is set to 1×10$^{13}$ atoms/cm$^2$ to form first impurity regions 924 to 927 with increased impurity concentration and second impurity regions 928 to 931 that are in contact with the first impurity regions 924 to 927. In this step, depending on the doping condition, the impurity may reach under the second shape conductive layers 918 to 921 so that the second impurity regions 928 to 931 overlap the second shape conductive layers 918 to 921. The impurity concentration in the second impurity regions is set to 1×10$^{16}$ to 1×10$^8$ atoms/cm$^3$ (FIG. 9A).

Then as shown in FIG. 9B, impurity regions 933 (933a and 933b) and 934 (934a and 934b) having the conductivity type reverse to the one conductivity type are respectively formed in the semiconductor layers 902 and 905 that are to form p-channel TFTs. In this case also, the semiconductor layers are doped with an impurity element that gives the p type conductivity while using as masks the second shape conductive layers 918 and 921 to form the impurity regions in a self-aligning manner. During this doping, the semiconductor layers 903 and 904 that are to form n-channel TFTs are completely covered with resist masks 932. The impurity regions 933 and 934 here are formed by ion doping using diborane (B$_2$H$_6$). The concentration of the impurity element that gives the p type conductivity in the impurity regions 933 and 934 is set to 2×10$^{20}$ to 2×10$^{21}$ atoms/cm$^3$.

When looked at more closely, the impurity regions 933 and 934 can be divided into two regions containing an impurity element that gives the n type conductivity. Third impurity regions 933a and 934a contain the impurity element that gives the n type conductivity in a concentration of 1×10$^{20}$ to 1×10$^{21}$ atoms/cm$^3$. Fourth impurity regions 933b and 934b contain the impurity element that gives the n type conductivity in a concentration of 1×10$^{17}$ to 1×10$^{20}$ atoms/cm$^3$. However, the third impurity regions have no problem in functioning as source regions and drain regions of p-channel TFTs if the concentration of the impurity element giving the p type conductivity in the impurity regions 933b and 934b is set to 1×10$^{19}$ atoms/cm$^3$ or higher, and if the third impurity regions 933a and 934a contain the impurity element giving the p type conductivity in a concentration 1.5 to 3 times higher than the concentration of the impurity element that gives the n type conductivity.

Thereafter, as shown in FIG. 9C, a first interlayer insulating film 937 is formed on the second shape conductive layers 918 to 921 and the gate insulating film 906. The first interlayer insulating film 937 may be a silicon oxide film, a silicon oxynitride film, a silicon nitride film, or a laminate having these films in combination. In either case, the first interlayer insulating film 937 is formed from an inorganic insulating material. The thickness of the first interlayer insulating film 937 is 100 to 200 nm. When a silicon oxide film is used for the first interlayer insulating film 937, plasma CVD is employed in which electric discharge is made using a mixture of TEOS and O$_2$ and setting the reaction pressure to 40 Pa, the substrate temperature to 300 to 400° C., and the high frequency (13.56 MHz) power density to 0.5 to 0.8 W/cm$^2$. When a silicon oxynitride film is used for the first interlayer insulating film 937, one formed by plasma CVD from SiH$_4$, N$_2$O, and NH$_3$, or one formed by plasma CVD from SiH$_4$ and N$_2$O is chosen. Film formation conditions in this case include setting the reaction pressure to 20 to 200 Pa, the substrate temperature to 300 to 400° C. and the high frequency (60 MHz) power density to 0.1 to 1.0 W/cm. A silicon oxynitride hydrate film formed from SiH$_4$, N$_2$O, and H$_2$ may also be used as the first interlayer insulating film 937. Similarly, a silicon nitride film can be formed by plasma CVD from SiH$_4$ and NH$_3$ as the first interlayer insulating film.

Then the impurity elements used in doping to give the n type and p type conductivities in the respective concentrations are activated. The activation step is carried out by thermal annealing using an annealing furnace. Other activation methods adoptable include laser annealing and rapid thermal annealing (RTA). The thermal annealing is conducted in a nitrogen atmosphere with an oxygen concentration of 1 ppm or less, preferably 0.1 ppm or less, at 400 to 700° C. typically 500 to 600° C. In this example, the substrate is subjected to heat treatment at 550° C. for four hours. However, if a plastic substrate weak against heat is used for the substrate 901, laser annealing is preferred.

Following the activation step, the atmosphere gas is changed to one containing 3 to 100% hydrogen and heat treatment is conducted at 300 to 450° C. for one to twelve hours to thereby hydrogenate the semiconductor layers. The hydrogenation step is to terminate dangling bonds contained in the semiconductor layers in 10$^{16}$ to 10$^{18}$ atoms/cm$^3$, using thermally excited hydrogen. Alternatively, plasma hydrogenation (using hydrogen that is excited by plasma) may be employed. In either case, the defect density in the semiconductor layers 902 to 905 is reduced desirably to 10$^{16}$ atoms/cm$^3$ or lower and, to reduce the density to this level, about 0.01 to 0.1 atomic % hydrogen is given.

A second interlayer insulating film 939 is formed next from an organic insulating material to have an average thickness of 1.0 to 2.0 μm. Organic resin materials such as polyimide, acrylic, polyamide, polyimideamide, and BCB (benzocyclobutene) can be used. If polyimide of the type that is thermally polymerized after being applied to a substrate is used, for example, the film is formed by burning the substrate in a clean oven at 300° C. If an acrylic is used, two-pack type is chosen. After the main component is mixed with the curing agent, the resin is applied to the entire surface of the substrate using a spinner, and then the substrate is pre-heated on a hot plate at 80° C. for 60 seconds to be burnt in a clean oven at 250° C. for 60 minutes, thereby forming the insulating film.

When the second interlayer insulating film 939 is thus formed from an organic insulating material, the surface can be leveled satisfactorily. Also, the parasitic capacitance can be reduced since organic resin materials have low dielectric constant in general. However, organic resin materials are hygroscopic and it is therefore preferable to combine the organic resin film with the silicon oxide film, or the silicon oxynitride film, or the silicon nitride film, formed as the first interlayer insulating film 937 as in this example.

Furthermore, an insulating film 940 is formed on the second interlayer insulating film 939 made of the organic insulating material. For the formation of the insulating film 940, the following is used: for example, an inorganic insulating material containing silicon or aluminum, such as silicon oxide, silicon nitride (SiN), silicon oxide nitride (SiON), silicon nitride oxide(SiNO), aluminum nitride (AlN), aluminum nitride oxide (AlNO) or aluminum oxide nitride (AlON). The insulating film 940 formed in this step may be formed in the same way of forming the first interlayer insulating film 937.

Thereafter, a resist mask having a given pattern is formed, and then contact holes are made in impurity regions formed in the respective semiconductor layers and constituting source regions and drain regions. The contact holes are made by dry etching. In this case, a mixture gas of $CF_4$ and $O_2$ is first used as an etching gas to etch the insulating film 940, and a mixture gas of $CF_4$, $O_2$ and He is then used to etch the second interlayer insulating film made of the organic resin material. Thereafter, a mixture gas of $CF_4$ and $O_2$ is again used to etch the first interlayer insulating film 937. Furthermore, the gate insulating film 570 having the third shape is etched in the state that the etching gas is changed to $CHF_3$ in order to heighten the etching selection ratio thereof to the semiconductor layer. In this way, the contact holes can be made.

A conductive metal film is formed by sputtering or vacuum evaporation, and patterned with a mask. Thereafter, this film is etched to form source wirings 941–944 and drain wirings 945–947. In the present example, the wirings are composed of a laminated film of a Ti film having a film thickness of 50 nm and an alloy film (alloy film made of Al and Ti) having a film thickness of 500 nm, which is not illustrated.

Figure 10A:
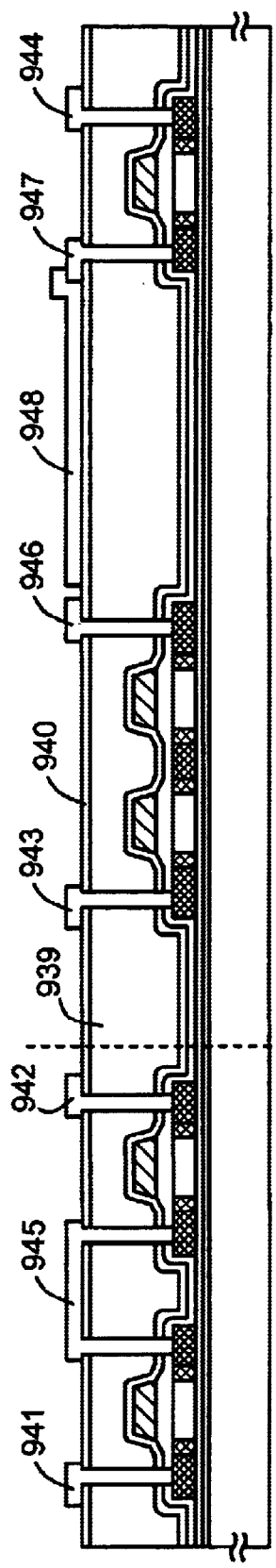
FIGS. 10A and 10B are explanatory views of producing-steps.

Next, a transparent conductive film having a film thickness of 80 to 120 nm is formed thereon, and patterned to form anodes 948 (FIG. 10A). In the present example, as the transparent anodes, there is used an indium tin oxide (ITO) film or a transparent conductive film wherein indium oxide is mixed with 2 to 20% of zinc oxide (ZnO).

The anodes 948 are formed to contact and overlap the drain wirings 947. In this way, the anodes 948 are electrically connected to the drain regions of the current-controlling TFTs.

Figure 10B:
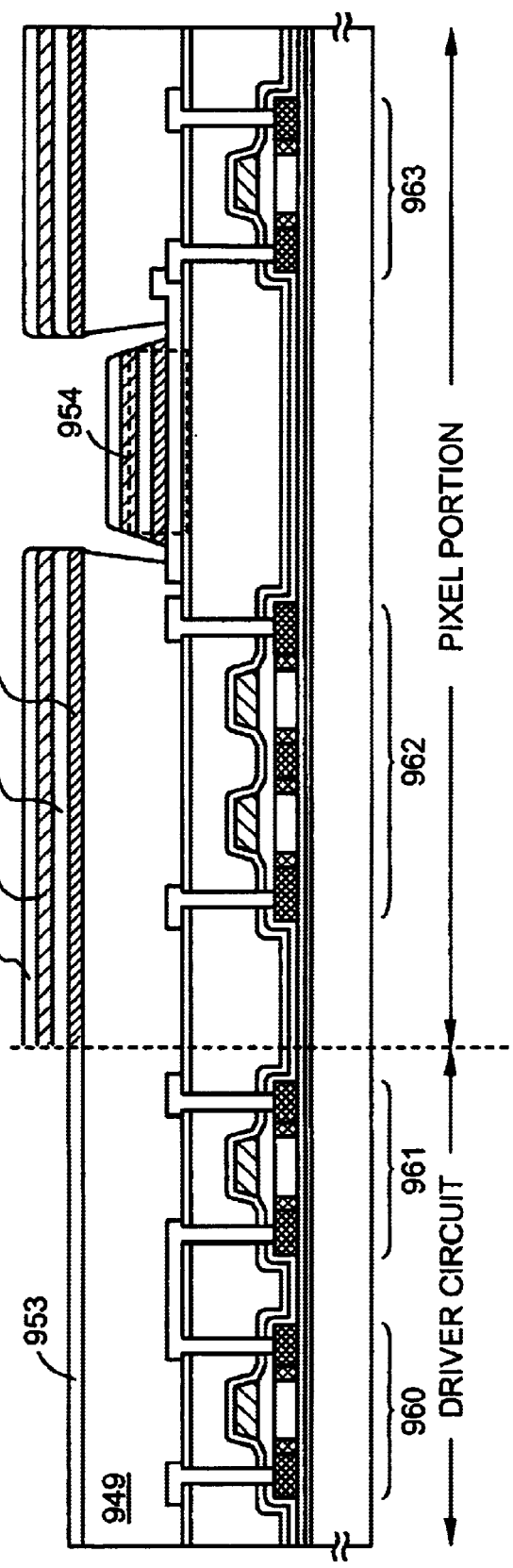

Next, a third interlayer insulating film 949 having openings at positions corresponding to the anodes 948 is formed, as illustrated in FIG. 10B. The third interlayer insulating film 949 has electric non-conductance, and functions as banks to exhibit the effect of isolating the organic compound layer pieces as adjacent pixels. In the present example, the third interlayer insulating film 949 is formed, using a resist.

In the present example, the thickness of the third interlayer insulating film 949 is set to about 1 μm. Each of the openings becomes wider at position thereof nearer to the corresponding anode 948. That is, the opening is made to be in an inversely-tapered form. The openings are made by forming a film of a resist, covering portions other than portions where the openings are to be made with a mask, irradiating the portions to UV light so as to be exposed, and then removing the exposed portions with a developing solution.

The third interlayer insulating film 949 is made into the inversely-tapered form in the present example. As a result, the organic compound layer, when deposited in a subsequent step, is divided into parts corresponding to adjacent pixels. Therefore, even if the thermal expansion coefficient of the organic compound layer is different from that of the third interlayer insulating film 949, the organic compound layer can be prevented from being cracked or exfoliated.

In the present example, the film made of the resist is used as the third interlayer insulating film. In some case, however, there may be used a film made of polyimide, polyamide, polyacrylate, benzocyclobutene (BCB), silicone oxide or the like. The third interlayer insulating film 949 may be made of an organic material or an inorganic material if the interlayer insulating film 949 has electric non-conductance. At this time, the anodes 948 are subjected to heat treatment at 230 to 350° C. to crystallize the transparent conductive film constituting the anodes 948.

Next, the surfaces of the anodes are subjected to flattening treatment. In the present example, Bellclean (made by Ozu Corp.) is used to wipe/clean the surfaces of the anodes 948. In this way, the surfaces of the anodes 948 are flattened.

At this time, pure water is used as a washing liquid. The rotation number of the axis around which the Bellclean is wound is set to 100 to 300 rpm, and the pushing value is set to 0.1 to 1.0 mm.

Next, an organic compound layer 950, cathodes 951, protective electrodes 952 and a passivation film 953 are formed by vapor deposition, as illustrated in FIG. 10B. In the present example, Mg/Ag electrodes are used as the cathodes of the light emitting elements. However, some other known material may be used.

The organic compound layer 950 is formed by combining and laminating plural layers such as a light emitting layer, a hole injection layer, a hole transport layer, an electron transport layer, an electron injection layer and a buffer layer. The configuration of the organic compound layer used in the present example will be specifically described hereinafter.

In the present example, a hole injection layer and a hole transport layer are formed by vapor deposition of CuPc and α-NPD, respectively.

Next, different materials are used to form light emitting layers emitting different light rays (that is, red, green and blue light rays) in the present example. Since vapor deposition is used for the formation of the respective light emitting layers, the light emitting layers can be made from different materials corresponding to the respective pixels by using metal masks.

The light emitting layer emitting red light can be formed, using $Alq_3$ doped with 4-dicyanomethylene-2-methyl-6-(p-dimethylamino-styryl)-4H-pyran (abbreviated to "DCM1" hereinafter), 4-dicyanomethylene-2-methyl-6-(julolidine-4-yl-vinyl)-4H-pyran (abbreviated to "DCM2" hereinafter) or the like. There may be used N,N'-disalicylidene-1,6-hexanediaminato)zinc (II) (abbreviated to Zn(salhn) hereinafter) doped with (1,10-phenanthroline)tris(1,3-diphenyl-propane -1,3-dionate)europium (III) (abbreviated to $Eu(DBM)_3(Phen)$ hereinafter), which is a Eu complex; or a known material.

The light emitting layer emitting green light can be formed by co-evaporation of CBP and $Ir(ppy)_3$. In this case, it is preferred that BCP is used to deposit a hole barrier layer beforehand. $Alq_3$ or a benzoquinolinolate beryllium complex (BeBq) may be also used. $Alq_3$ doped with coumalin 6 or qunacridon, or a known material may be used.

The light emitting layer emitting blue light can be formed, using 4,4'-bis(2,2-diphenyl-vinyl)-biphenyl (abbreviated to DPVBi hereinafter), which is a distyryl derivative; Zn(salhn), which is an zinc complex having an azomethine compound as a ligand, and DPVBi doped with perylene; or a known material.

Next, an electron transport layer is formed. The electron transport layer can be formed, using a material such as a 1,3,4-oxadiazole derivative or a 1,2,4-triazole derivative (TAZ). In the present example, the TAZ is used to form the electron transport layer having a film thickness of 30 to 60 nm by vapor deposition.

As described above, the organic compound layer having the lamination configuration is formed. In the present example, it is advisable to set the film thickness of the organic compound layer 950 to 10 to 400 nm (typically, 60 to 150 nm) and set to the film thickness of the cathodes 951 to 80 to 200 nm (typically, 100 to 150 nm).

After the formation of the organic compound layer, the cathodes 951 of the light emitting elements are formed by vapor deposition. In the present example, a film made of Mg and Ag is used as the conductive film constituting the cathodes of the light emitting elements. However, there may be used a film made of Al and Li, or a film made by co-evaporation of an element belonging to the 1 or 2 group in the periodic table and aluminum.

After the formation of the cathodes 951, the protective electrodes 952 are formed. The protective electrodes 952 make it possible to protect the organic compound layer 950 from water content or oxygen. More preferably, the passivation film 953 is deposited. In the present example, a silicon nitride film having a thickness of 300 nm is deposited as the protective film 953. After the formation of the protective electrodes 952, this protective film may be continuously formed without exposure of the protective electrodes to the atmosphere.

The protective electrodes 952 are formed to prevent the cathodes from deteriorating, and are typically composed of a metal film made mainly of aluminum. Some other material may be used. The organic compound layer 950 and the cathodes 951 are very weak against water. Therefore, in the middle of the present manufacturing process, it is desired that the respective layers are continuously formed, without exposure thereof to the atmosphere, until the protective electrodes 952 are formed.

In this way, a light emitting device having a configuration as illustrated in FIG. 10B is finished. A portion 954 wherein the anode 947, the organic compound layer 950 and the cathode 951 are stacked with each other corresponds to the light emitting element.

P-channel type TFTs 960 and n-channel type TFTs 961 are TFTs which a driving circuit has, and constitute a CMOS. Switching TFTs 962 and current-controlling TFTs 963 are TFTs which a pixel section has. The TFTs in the driving circuit and the TFTs in the pixel section can be formed on the same substrate.

In the case of a light emitting device using light emitting elements, the voltage of a power supply for its driving circuit is about 5 to 6 V, at most about 10 V. Therefore, deterioration of its TFTs by hot electrons is not caused very much. Since the driving circuit is required to be operated at a high speed, it is preferred that the gate capacity of the TFTs is as small as possible. Thus, in the driving circuit of the light emitting device using the light emitting elements in the present example, it is preferred that the second impurity region 929 which the semiconductor layer of the TFTs has does not overlap with the gate electrode 918 and the fourth impurity region 933b does not overlap with the gate electrode 919.

Example 5

As the present example, the following will describe a process for producing a light emitting device which is different from the process of Example 4.

The steps until a second interlayer insulating film 939 is formed are the same as in Example 1. As illustrated in FIG. 11A, after the formation of the second interlayer insulating film 939, an insulating film 940 is formed to contact the second interlayer insulating film 939.

The insulating film 940 has an effect of preventing invasion of water content contained in the second interlayer insulating film 939 into an organic compound layer 950 through anodes 948 and a third interlayer insulating film 982. In the case that the second interlayer insulating film 939 comprises an organic resin material, it is particularly effective to form the insulating film 940 since the organic resin material contains a great deal of water content. In the present example, a silicon nitride film is used as the insulating film 940.

Thereafter, a resist mask having a given pattern is formed. Contact holes are then made, which reach impurity regions formed in the respective semiconductor layers and constituting source and drain regions. The contact holes are made by dry etching. In this case, a mixture gas of $CF_4$ and $O_2$ is first used as an etching gas to etch the insulating film 940, and then a mixture gas of $CF_4$, $O_2$ and He is used to etch the second interlayer insulating film 939 made of the organic resin material. Thereafter, a mixture gas of $CF_4$ and $O_2$ is again used as an etching gas to etch the first interlayer insulating film 937. The gate insulating film having the third shape is etched in the state that the etching gas is changed to $CHF_3$ in order to heighten the etching selection ratio thereof to the semiconductor layer. In this way, the contact holes can be made.

A conductive metal film is formed by sputtering or vacuum evaporation, patterned with a mask, and etched to form source wirings 941 to 944 and drain wirings 945 to 947. In the present example, the wirings are composed of a laminated film of a Ti film having a film thickness of 50 nm and an alloy film (alloy film of Al and Ti) having a film thickness of 500 nm, which is not illustrated.

Next, a transparent conductive film is formed thereon to have a thickness of 80 to 120 nm, and is then patterned to form anodes 948 (FIG. 11A). In the present example, as the transparent electrodes, an indium tin oxide (ITO) film or a transparent conductive film wherein indium oxide is mixed with 2 to 20% of zinc oxide (ZnO) is used.

The anodes 948 are formed to contact and overlap the drain wirings 947. In this way, the anodes 948 are electrically connected to the drain regions of the current-controlling TFTs.

Next, a third interlayer insulating film 982 having openings at positions corresponding to the anodes 948 is formed, as illustrated in FIG. 11B. At the time of making the openings in the present example, wet etching is used to make the side walls thereof into a tapered form. In this case, which is different from the case described as Example 4, the organic compound layer formed on the third interlayer insulating film 982 is not divided. Therefore, if the side walls of the openings are not sufficiently gently-sloping, deterioration of the organic compound layer, based on level-difference, is markedly caused. Thus, attention should be paid.

In the present example, a film made of silicon oxide is used as the third interlayer insulating film 982. In some case, an organic resin film made of polyimide, polyamide, polyacrylate, benzocyclobutene (BCB) or the like may be used.

Heat treatment at 230 to 350° C. is then conducted to crystallize the transparent conductive film constituting the anodes 948.

Next, the surfaces of the anodes are subjected to flattening treatment. In the present example, Bellclean (made by Ozu Corp.) is used to wipe/clean the surfaces of the anodes 948. In this way, the surfaces of the anodes 948 are flattened.

At this time, pure water is used as a washing liquid. The rotation number of the axis around which the Bellclean is wound is set to 100 to 300 rpm, and the pushing value is set to 0.1 to 1.0 mm.

Before an organic compound layer 950 is formed on the third interlayer insulating film 982, the surface of the third interlayer insulating film 982 is preferably subjected to plasma treatment using argon so as to make the surface of the third interlayer insulating film 982 dense. According to this configuration, it is possible to prevent invasion of water content from the interlayer insulating film 982 to organic compound layer 950.

Next, the organic compound layer 950 is formed by vapor deposition. Furthermore, cathodes (Mg/Ag electrodes) 951 and protective electrodes 952 are formed by vapor deposition. It is desired to subject the anodes 947 to heat treatment before the formation of the organic compound layer 950 and the cathodes 951 so as to remove water content completely. In the present example, the Mg/Ag electrodes are used as the cathodes of the light emitting elements. However electrodes made of some other known material may be used.

As the material of the organic compound layer 950, there may be used a known low-molecule or high-molecule organic material. In the present example, a case in which a high-molecule material is used to form the organic compound layer will be described. Needless to say, however, a low-molecule material as used in Examples 1–4 can be used. The material of which the organic compound layer is made may be common to all pixels. However, in the case that a material emitting red light, a material emitting green light, and a material emitting blue light are separately applied to respective pixels, full color display can be attained because of the presence of organic compound layers made of the different materials. An example of the combination of the materials emitting blue, green and red light is as follows.

The organic compound layer emitting red light can be formed by applying the following coating solution by spin coating: a coating solution obtained by dispersing 30 to 40% of 2-(4-biphenyl)-5-(4-tert-butylphenyl)-1,3,4-oxadiazole (abbreviated to PBD hereinafter), which is an electron transporting material, in a molecular form into polyvinyl carbazole (abbreviated to PVK hereinafter), which is a hole transporting material, and then adding about 1% of DCM2 as a dopant to the resultant solution.

The organic compound layer emitting green light can be formed by applying the following coating solution by spin coating: a coating: solution obtained by dispersing 30 to 40% of PBD in a molecular form into PVK and then adding about 1% of coumalin as a dopant to the resultant solution.

The organic compound layer emitting blue light can be formed by applying the following coating solution by spin coating: a coating solution obtained by dispersing 30 to 40% of PBD in a molecular form into PVK and then adding about 1% of perylene as a dopant to the resultant solution.

Any one of these materials can be used commonly to all of the pixels, or these materials may be separately used in the respective pixels.

The protective electrodes 952 make it possible to protect the organic compound layer 950 from water content or oxygen. Preferably, a protective film 953 is deposited. In the present example, a silicon nitride film having a thickness of 300 nm is deposited as the protective film 953. After the formation of the protective electrodes 952, this protective film may be continuously formed without exposure thereof to the atmosphere.

The protective electrodes 952 are formed to prevent the deterioration of the cathodes 951, and is typically a metal film made mainly of aluminum. Of course, some other material may be used. Since the organic compound layer 950 and the cathodes 951 are very weak against water content, it is desired that the steps until the protective electrodes 952 are formed are continuously performed without exposure of the respective layers to the atmosphere, thereby protecting the organic compound layer from the open air. The cathodes 951 and the protective electrodes 952 are formed by vapor deposition using a metal mask.

It is advisable to set the film thickness of the organic compound layer 950 to 10 to 400 nm (typically, 60 to 150 nm) and set to the film thickness of the cathodes 951 to 80 to 200 nm (typically, 100 to 150 nm).

In this way, a light emitting device having a configuration as illustrated in FIG. 11B is completed. A portion 954 wherein the anode 948, the organic compound layer 950 and the cathode 951 are stacked with each other corresponds to the light emitting element.

P-channel type TFTs 960 and n-channel type TFTs 961 are TFTs which a driving circuit has, and constitute a CMOS. Switching TFTs 962 and current-controlling TFTs 963 are TFTs which a pixel section has. The TFTs in the driving circuit and the TFTs in the pixel section can be formed on the same substrate. The process for producing a light emitting device of the present invention is not limited to the production process described as the present example.

Example 6

As the present example, the following will specifically describe a process in which the light emitting panel produced as illustrated in FIG. 10B in Example 4 or the light emitting panel produced as illustrated in FIG. 11B in Example 5 is caused to be completed as a light emitting device, referring to FIGS. 12A and 12B.

FIG. 12A is a top view of the light emitting panel wherein the element substrate is airtightly sealed, and FIG. 12B is a sectional view taken on line A—A' of FIG. 12A. Reference number 801 represents a source driving side circuit, which is illustrated by dot lines; reference number 802, a pixel section, reference number 803, a gate side driving circuit; reference number 804, a sealing substrate, and reference number 805, a sealing agent. The inside surround by the seal agent 805 is a space 807.

Through wirings (not illustrated) for transmitting signals inputted to the source side driving circuit 801 and the gate side driving circuit 803, video signals or clock signals are received from a flexible print circuit (FPC) 809, which is an external input terminal. The state that the FPC is connected to the light emitting panel is shown herein. In the present specification, any module on which integrated circuits (ICs) are directly mounted is referred to as a light emitting device.

Referring to FIG. 12B, the following will describe the sectional configuration of the light emitting panel illustrated in FIG. 12A. The pixel section 802 and the source side driving circuit 801 are formed above a substrate 810. The pixel section 802 is composed of pixels, each of which includes a current-controlling TFT 811 and an anode 812 connected electrically to its drain. The source side driving circuit 801 is composed of a CMOS circuit wherein an n-channel type TFT 813 and a p-channel type TFT 814 are combined with each other.

Banks 815 are formed at both sides of each of the anodes 812. Thereafter, an organic compound layer 816 and cathodes 817 are formed on the anodes 812 to produce light emitting elements 818.

The cathodes 817 function as a wiring common to all of the pixels, and are electrically connected to the FPC 809 through a wiring 808.

After the formation of the light emitting elements 818, a passivation film 821 is formed. This is because the sealing agent 805 is directly formed on the wiring 808. The passivation film 821 makes it possible to heighten the adhesion of the sealing agent to the wiring 808.

The sealing substrate 804 made of glass is stuck to the substrate 810 with the sealing agent 805. As the sealing agent 805, an ultraviolet setting resin or thermosetting resin is preferably used. If necessary, a space composed of a resin film may be disposed in order to keep an interval between the sealing substrate 804 and the light emitting elements 818. An inert gas such as nitrogen or rare gas is filled into the space 807 surrounded by the sealing agent 805. It is desired that the sealing agent 805 is made of a material whose water- or oxygen-permeability is as small as possible.

By putting the light emitting elements airtightly into the space 807 in the above-mentioned configuration, the light emitting elements can be completely shut off from the outside. As a result, it is possible to prevent the deterioration of the light emitting elements by water content or oxygen from the outside. Accordingly, a light emitting device having high reliability can be yielded.

The configuration of the present example may be combined with the configuration of Example 4 or 5 at will.

Example 7

Figure 13A:
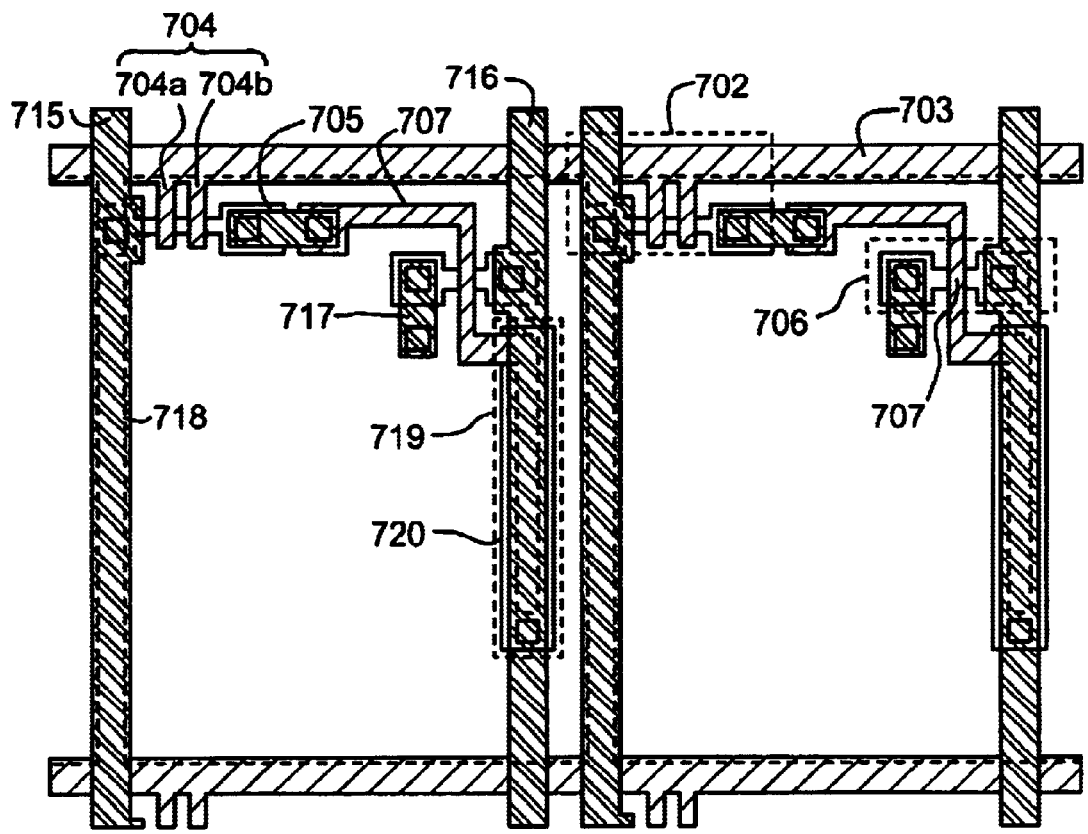
FIGS. 13A and 13B are explanatory views of a configuration of a pixel section.
Figure 13B:
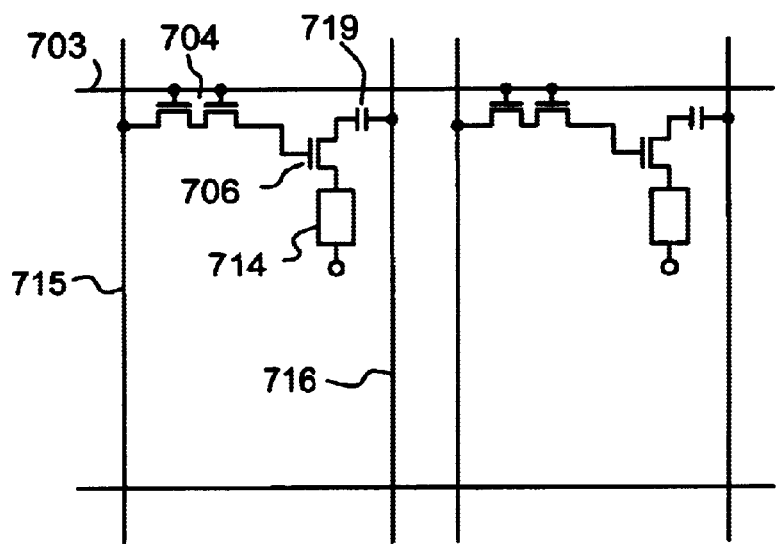

FIG. 13A more specifically illustrates the top face configuration of the pixel section of the light emitting device produced using the present invention and described as Examples 4 and 5, and FIG. 13B illustrates a circuit diagram thereof. Referring to FIGS. 13A to 13B, a switching TFT 704 is composed of the switching (n-channel) TFT 962 as illustrated in FIG. 10. Accordingly, about the configuration thereof the description on the switching (n-channel) TFT 962 should be referred to. A wiring 703 is a gate wiring for connecting gate electrodes 704a and 704b of the switching TFT 704 electrically with each other.

In the present example, a double gate configuration, wherein two channel forming regions are formed is adopted. However, a single gate configuration, wherein one channel forming region is formed, or a triple gate configuration, wherein three channel forming regions are formed, may be adopted.

The source of the switching TFT 704 is connected to a source wiring 715, and the drain thereof is connected to a drain wiring 705. The drain wiring 705 is electrically connected to a gate electrode 707 of the current-controlling TFT 706. The current-controlling TFT 706 is composed of the current-controlling (p-channel type) TFT 963. Therefore, about the configuration thereof, the description on the switching (p-channel) TFT 963 should be referred to. In the present example, a single gate configuration is adopted. However, a double gate configuration or a triple gate configuration may be adopted.

The source of the current-controlling TFT 706 is electrically connected to a current-supplying line 716. The drain thereof is electrically connected to a drain wiring 717. The drain wiring 717 is electrically connected to an anode (pixel electrode) 718 illustrated by dot lines.

In this case, a retention capacitor (condenser) is formed in a region 719. The condenser 719 is composed of a semiconductor film 720 connected electrically to the current-supplying line 716, a non-illustrated insulating film which is formed into the same layer as the gate insulating film, and the gate electrode 707. A capacitor composed of the gate electrode 707, a non-illustrated layer which is formed into the same layer as the first interlayer insulating film, and the current-supplying line 716 may be used as a retention capacitor.

The configuration of the present example may be combined with that of Example 4 or 5 at will.

Example 8

A light emitting device using a light emitting element is self-light emitting and therefore is superior in visibility in bright surroundings compared to liquid crystal display devices and has wider viewing angle. Accordingly, various electronic devices can be completed by using the light emitting device of the present invention.

Examples of electronic devices employing a light emitting device of the present invention is are: a video camera; a digital camera; a goggle type display (head mounted display); a navigation system; an audio reproducing device (car audio, an audio component, and the like); a notebook computer; a game machine; a portable information terminal (a mobile computer, a cellular phone, a portable game machine, an electronic book, etc.); and an image reproducing device (specifically, a device capable of processing data in a recording medium such as a digital versatile disk (DVD) and having a display device that can display the image of the data). The light emitting device having a light emitting element is desirable particularly for a portable information terminal since its screen is often viewed obliquely and is required to have a wide viewing angle. Specific examples of the electronic devices are shown in FIGS. 14A to 14H.

Figure 14A:
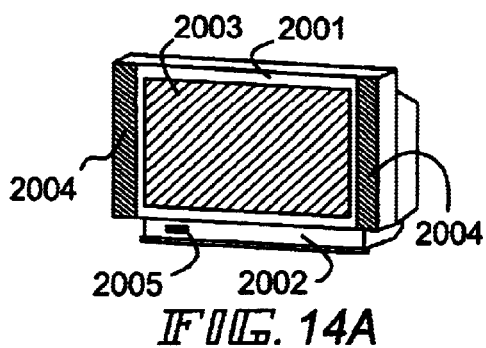
FIGS. 14A to 14H are explanatory views of examples of an electrical appliance.

FIG. 14A shows a display device, which is composed of a casing 2001, a supporting base 2002, a display unit 2003, speaker units 2004, a video input terminal 2005, etc. The light emitting device of the present invention is applied can be used for the display unit 2003. The light emitting device having a light emitting element is self-light emitting and does not need a backlight, so that it can make a thinner display unit than liquid display devices can. The term display device includes every display device for displaying information such as one for a personal computer, one for receiving TV broadcasting, and one for advertisement.

Figure 14B:
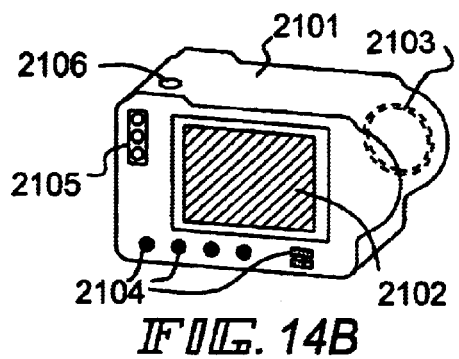

FIG. 14B shows a digital still camera, which is composed of a main body 2101, a display unit 2102, an image receiving unit 2103, operation keys 2104, an external connection port 2105, a shutter 2106, etc. The digital camera is formed by using the light emitting device of the present invention to the display unit 2102.

Figure 14C:
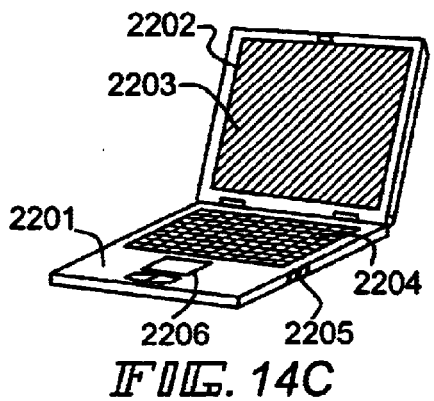

FIG. 14C shows a notebook computer, which is composed of a main body 2201, a casing 2202, a display unit 2203, a keyboard 2204, an external connection port 2205, a pointing mouse 2206, etc. The notebook computer is formed by using the light emitting device of the present invention to the display unit 2203.

Figure 14D:
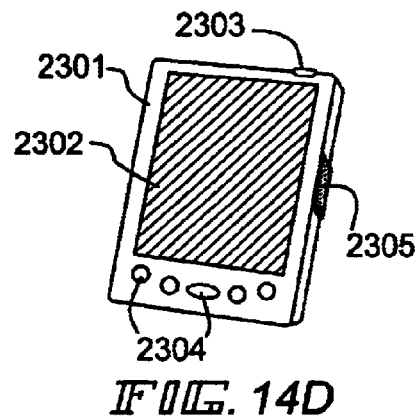

FIG. 14D shows a mobile computer, which is composed of a main body 2301, a display unit 2302, a switch 2303, operation keys 2304, an infrared ray port 2305, etc. The mobile computer is formed by using the light emitting device of the present invention to the display unit 2302.

Figure 14E:
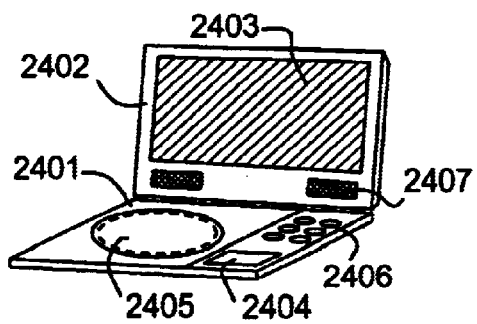

FIG. 14E shows a portable image reproducing device equipped with a recording medium (a DVD player, to be specific). The device is composed of a main body 2401, a casing 2402, a display unit A 2403, a display unit B 2404, a recording medium (DVD) reading unit 2405, operation keys 2406, speaker units 2407, etc. The display unit A 2403 mainly displays image information whereas the display unit B 2404 mainly displays text information. The portable image reproducing device is formed by using the light emitting device of the present invention to the display units A 2403 and B 2404. The term image reproducing device equipped with a recording medium includes video game machines.

Figure 14F:
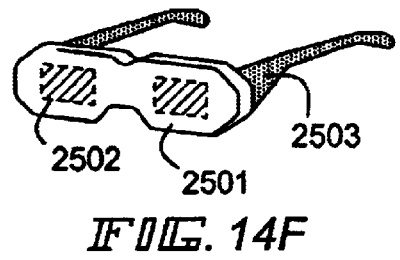

FIG. 14F shows a goggle type display (head mounted display), which is composed of a main body 2501, display units 2502, and arm units 2503. The goggle type display is formed by using the light emitting device of the present invention to the display unit 2502.

Figure 14H:
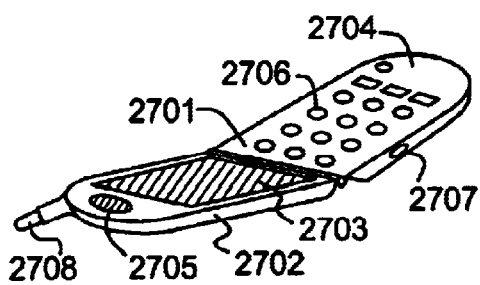
Figure 14G:
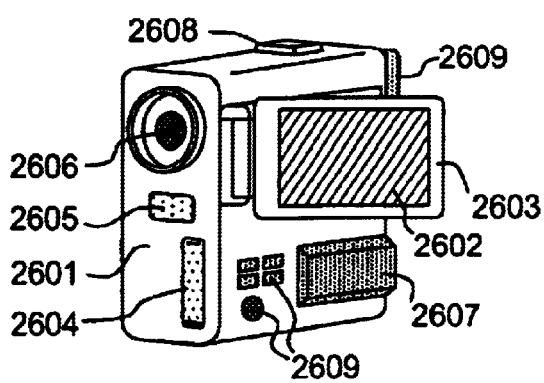

FIG. 14G shows a video camera, which is composed of a main body 2601, a display unit 2602, a casing 2603, an external connection port 2604, a remote control receiving unit 2605, an image receiving unit 2606, a battery 2607, an audio input unit 2608, operation keys 2609, an eye piece portion 2610 etc. The video camera is formed by using the light emitting device of the present invention to the display unit 2602.

FIG. 14H shows a cellular phone, which is composed of a main body 2701, a casing 2702, a display unit 2703, an audio input unit 2704, an audio output unit 2705, operation keys 2706, an external connection port 2707, an antenna 2708. etc. The cellular phone is formed by using the light emitting device of the present invention to the display unit 2703. If the display unit 2703 displays white characters on a black background, power consumption of the cellular phone can be reduced.

If the luminance of light emitted from organic materials is increased in future, the light emitting device having an organic element can be used also in a front or rear projector in which light bearing outputted image information is magnified by a lens or the like to be projected on a screen.

The electronic device given in the above often displays information distributed through electronic communication lines such as Internet and CATV (cable television), especially, animation information with increasing frequency. The light emitting device having a light emitting element is suitable for displaying animation information since organic materials have fast response speed.

In the light emitting device, portions that emit light consume power. Therefore it is desirable to display information such that as small portions as possible emits light. Accordingly, if the light emitting device is used for a display unit that mainly displays text information such as a portable information terminal, in particular, a cellular phone, and an audio reproducing device, it is desirable to assign light emitting portions to display text information while portions that do not emit light serve as the background.

As described above, the application range of the light emitting device to which the present invention is applied is very wide and electronic devices of every field can employ the device. The electronic devices in this example can be completed by using the light emitting device manufactured by implementing the method shown in Examples 1 to 7.

Example 9

In the present example, the state of the surface of a transparent conductive film subjected to a wiping/cleaning treatment of the present invention was observed with an atomic force microscope (AFM). The result is shown in FIG. 16.

In the surface observation in the present example, the surface of an ITO film formed on a glass substrate to have a film thickness of 110 nm and crystallized by heat treatment at 250° C. was used as a surface to be measured.

Figure 16:
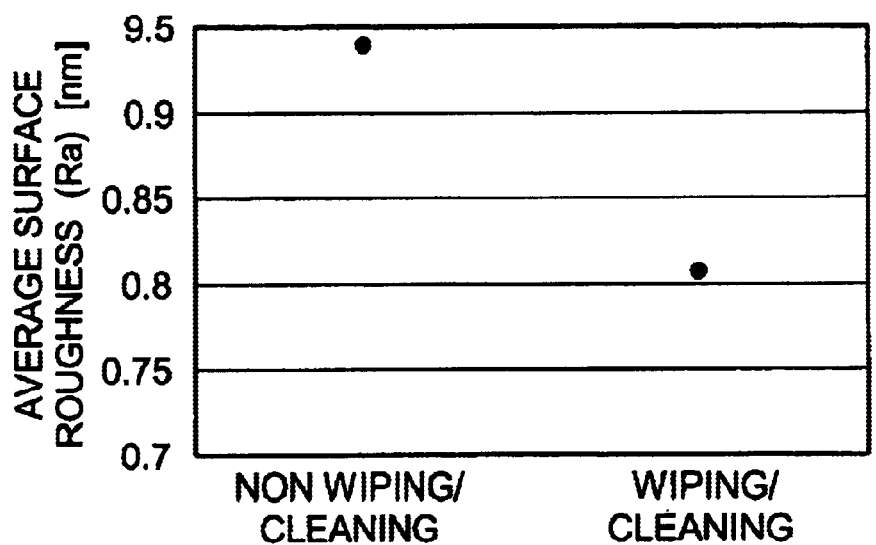
FIG. 16 is a graph showing results measured with an atomic force microscope (AFM).

FIG. 16 shows the average surface roughness (Ra) before and after the wiping/cleaning treatment with Bellclean. The average surface roughness referred to herein is a roughness obtained by expanding the center line average roughness defined in JIS B 0601 to three-dimension in such a manner that the average roughness can be applied to faces.

Figure 17:
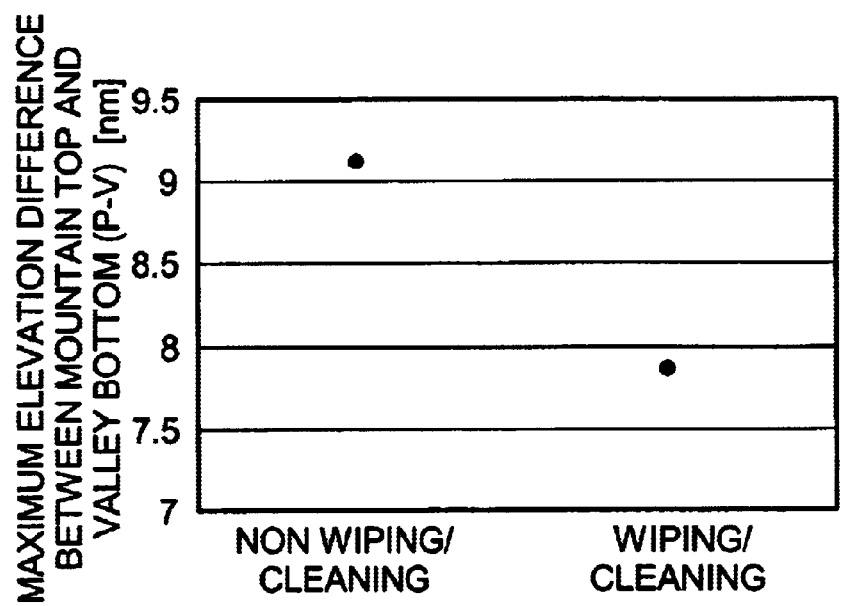
FIG. 17 is a graph showing results measured with the AFM.
Figure 18:
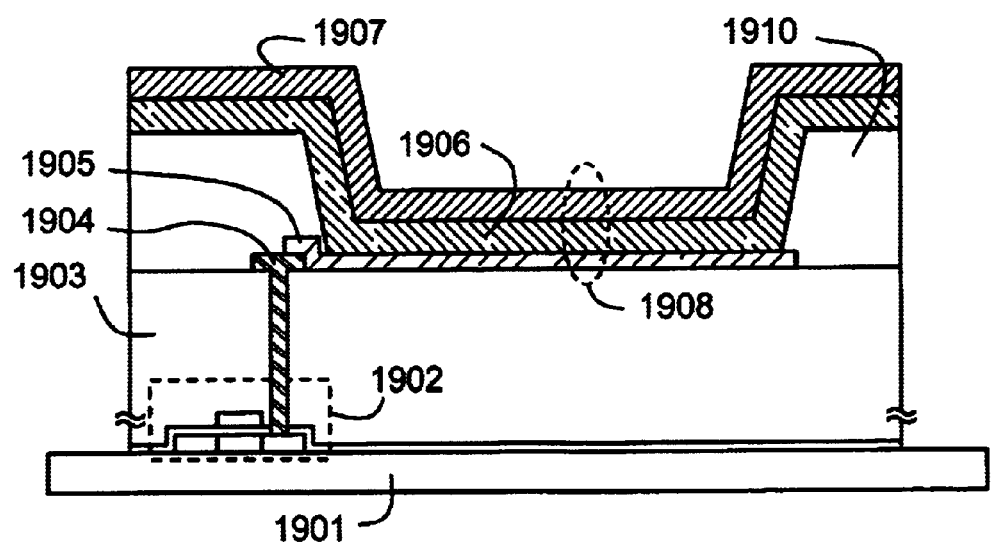
FIG. 18 is an explanatory view of an example in the prior art.

It can be understood from this result that after the wiping/cleaning treatment, the average surface roughness of the measured surface becomes small so that the flatness thereof is increased. FIG. 17 shows the maximum elevation difference (P–V) between mountains and valleys before and after the wiping/cleaning treatment with Bellclean. The "maximum elevation difference (P–V) between mountains and valleys" referred to herein is a difference between the mountain top and the valley bottom obtained by expanding the "mountain top" and the "valley bottom" defined in JIS B 0601 to three dimension. The mountain top is the highest point of mountains present in a designated face, and the valley bottom is the lowest point of valleys present in the designated face.

Figure 19:
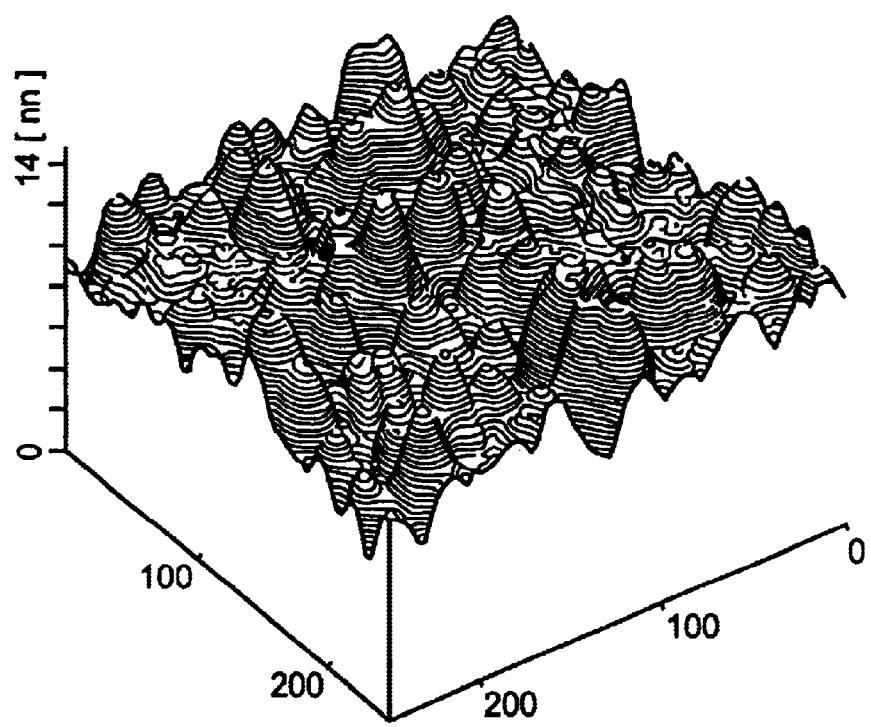
FIG. 19 is a graph showing results measured with the AFM.
Figure 20:
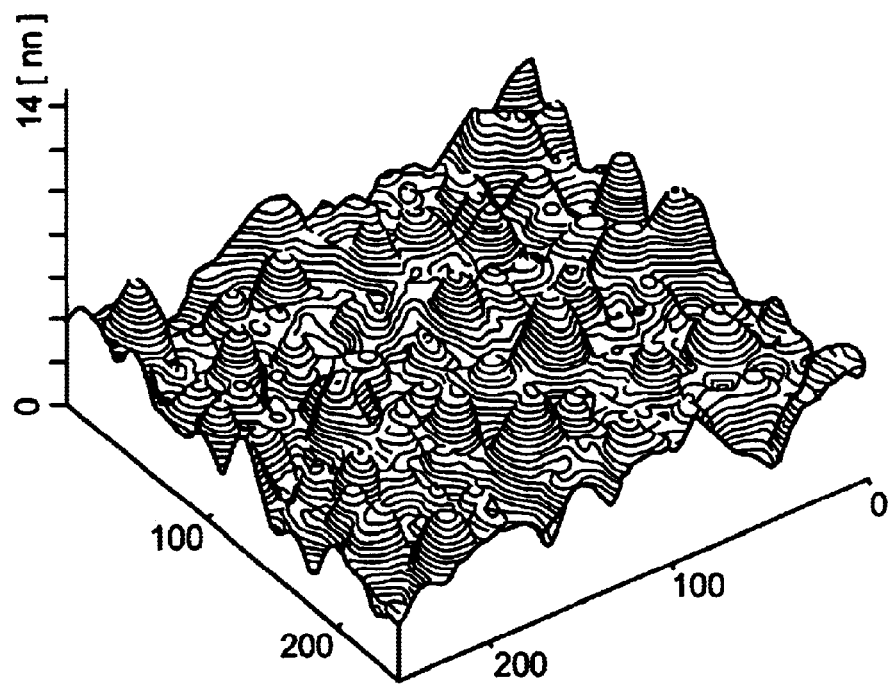
FIG. 20 is a graph showing results measured with the AFM.

It can also be understood from the maximum elevation difference (P–V) between the mountains and the valleys that the flatness of the measured surface is increased by the wiping/cleaning treatment. FIGS. 19 and 20 show the unevenness shape of the substrate, observed with the AFM. Specifically FIG. 19 shows a result obtained by observing the measured surface before the wiping/cleaning treatment, and FIG. 20 shows a result obtained by observing the measured surface after the wiping/cleaning treatment.

Not only the measurement of the contact angle but also the measurement results of the average surface roughness with the AFM demonstrate that the surface subjected to the wiping/cleaning treatment in the present invention is made flat.

As described above, by using present invention to form anodes of light emitting elements on an insulating film and wipe/clean the surfaces of the anodes so as to be made flat, the deterioration of the light emitting elements can be prevented. Furthermore, by making the surfaces of the anodes flat, the current density in an organic compound layer can be made high. Therefore, the light emitting brightness of the light emitting elements can be made high and driving voltage for the light emitting elements can be reduced. As a result, the life span of the light emitting elements can be made long.

What is claimed is:

1. A process for producing a light emitting device comprising the steps of:
    forming an anode comprising a transparent oxide film;
    wiping and cleaning the surface of the anode with a wiping and cleaning material;
    forming an organic compound layer on the anode after wiping and cleaning the surface of thereof; and
    forming a cathode on the organic compound layer.
2. The process for producing the light emitting device according to claim 1, wherein the anode is formed by sputtering.
3. The process for producing the light emitting device according to claim 1, wherein the surface is made flat by the wiping and cleaning.
4. The process for producing the light emitting device according to claim 1, wherein the wiping and cleaning material is a PVA-based porous body.

5. The process for producing the light emitting device according to claim 1, wherein the surface is wiped and cleaned with the wiping and cleaning material and a washing liquid.

6. The process for producing the light emitting device according to claim 1, wherein the surface is scrubbed with the wiping and cleaning material.

7. The process for producing the light emitting device according to claim 1, wherein when contact angle to the anode surface is smaller than 90° before the wiping and cleaning, the contact angle after the wiping and cleaning is larger than the contact angle before the wiping and cleaning and is smaller than 90°.

8. A process for producing an active matrix type light emitting device comprising the steps of:
   forming TFTs over a substrate;
   forming a first insulating film comprising organic resin material over the TFTs;
   forming a second insulating film comprising inorganic insulating material on the first insulating film;
   forming a transparent conductive film on the second insulating film; and
   wiping and cleaning the surface of the transparent conductive film with a wiping and cleaning material.

9. A process for producing an active matrix type light emitting device comprising the steps of:
   forming a thin film transistor over a substrate;
   forming a first insulating film comprising organic resin material over the thin film transistor;
   forming a second insulating film comprising inorganic insulating material on the first insulating film;
   forming an anode on the second insulating film; and
   wiping and cleaning the surface of the anode with a wiping and cleaning material.

10. The process for producing the active matrix type light emitting device according to claim 9, wherein the surface of the anode is made flat by the wiping and cleaning material.

11. The process for producing the active matrix type light emitting device according to claim 9, wherein the organic resin material is selected form the group consisting of polyacrylate, polyimide and polyamide.

12. The process for producing the active matrix type light emitting device according to claim 9, wherein the inorganic insulating material is selected from the group consisting of silicon oxide, silicon nitride, silicon oxide nitride, and silicon nitride oxide.

13. The process for producing the active matrix type light emitting device according to claim 9, wherein the wiping and cleaning material is a PVA-based porous body.

14. The process for producing the active matrix type light emitting device according to claim 9, wherein the anode is wiped and cleaned with the wiping and cleaning material and a washing liquid.

15. The process for producing the active matrix type light emitting device according to claim 9, wherein the surface of the anode is scrubbed with the wiping and cleaning material.

16. The process for producing the active matrix type light emitting device according to claim 9, wherein when contact angle to the surface of the anode is smaller than 90° before the wiping and cleaning, the contact angle after the wiping and cleaning is larger than the contact angle before the wiping and cleaning and is smaller than 90°.

17. A process for producing a light emitting device comprising the steps of:
   forming a transparent conductive film;
   forming an insulating film comprising an organic resin material on the transparent conductive film; and
   wiping and cleaning the surface of the insulating film with a wiping and cleaning material.

18. The process for producing the light emitting device according to claim 17, wherein the surface of the insulating film is made flat by the wiping and cleaning.

19. The process for producing the light emitting device according to claim 17, wherein the wiping and cleaning material is a PVA-based porous body.

20. The process for producing the light emitting device according to claim 17, wherein the surface of the insulating film is wiped and cleaned with the wiping and cleaning material and a washing liquid.

21. The process for producing the light emitting device according to claim 17, wherein the surface of the insulating film is scrubbed with the wiping and cleaning material.

22. The process for producing the light emitting device according to claim 17, wherein when contact angle to the insulating film is smaller than 90° before the wiping and cleaning, the contact angle after the wiping and cleaning is larger than the contact angle before the wiping and cleaning and is smaller than 90°.

23. The process for producing the light emitting device according to claim 17, wherein the insulating film is formed to have a film thickness of 1 to 50 nm.

24. The process for producing the light emitting device according to claim 17, wherein the insulating film comprises a material selected from the group consisting of polyacrylate, polyimide or polyamide.

25. A process for producing a light emitting device comprising the steps of:
   forming an anode;
   forming an insulating film comprising an organic resin material on the anode; and
   wiping and cleaning the surface of the insulating film with a wiping and cleaning material.

26. A process for producing an active matrix type light emitting device comprising the steps of:
   forming TFTs over a substrate;
   forming a first insulating film comprising an organic resin material over the TFTs;
   forming a second insulating film comprising an inorganic insulating material on the first insulating film;
   forming a transparent conductive film on the second insulating film;
   forming a third insulating film comprising an organic resin material on the transparent conductive film; and
   wiping and cleaning the surface of the third insulating film with a wiping and cleaning material.

27. The process for producing the light emitting device according to claim 26, wherein the surface of the third insulating film is made flat by the wiping and cleaning.

28. The process for producing the light emitting device according to claim 26, wherein the organic resin material is selected from the group consisting of polyacrylate, polyimide and polyamide.

29. The process for producing the light emitting device according to claim 26, wherein the inorganic insulating material is selected from the group consisting of silicon oxide, silicon nitride, silicon oxide nitride, and silicon nitride oxide.

30. The process for producing the light emitting device according to claim 26, wherein the wiping and cleaning material is a PVA-based porous body.

31. The process for producing the light emitting device according to claim 26, wherein the transparent conductive film is wiped and cleaned with the wiping and cleaning material and a washing liquid.

32. The process for producing the light emitting device according to claim 26, wherein the surface of the third insulating film is scrubbed with the wiping and cleaning material.

33. The process for producing the light emitting, device according to claim 26, wherein the third insulating film is formed to have a film thickness of 1 to 50 nm.

34. The process for producing the light emitting device according to claim 26, wherein the third insulating film is made of polyacrylate, polyimide or polyamide.

35. The process for producing the light emitting device according to claim 26, wherein when contact angle to the surface of the third insulating film is smaller than 90° before the wiping and cleaning, the contact angle after the wiping and cleaning is larger than the contact angle before the wiping and cleaning and is smaller than 90°.

36. The process for producing the light emitting device according to claim 26, wherein the TFT is manufactured by following steps:
   first step of forming a semiconductor layer over the substrate;
   second step of forming an insulating film on the semiconductor layer;
   third step of forming a conductive layer on the insulating film;
   fourth step of selectively etching the conductive layer to form a first conductive layer having a first tapered shape;
   fifth step of introducing an impurity element into the semiconductor layer;
   sixth step of selectively etching the first tapered shape; and
   seventh step of introducing the impurity element into the semiconductor layer,
   wherein the concentration of the impurity element introduced in the seventh step is lower than that introduced in the fifth step.

37. A process for producing an active matrix type light emitting device comprising the steps of:
   forming TFTs over a substrate;
   forming a first insulating film comprising an organic resin material over the TFTs;
   forming a second insulating film comprising an inorganic insulating material on the first insulating film;
   forming an anode on the second insulating film;
   forming a third insulating film comprising an organic resin material on the anode; and
   wiping and cleaning the surface of the third insulating film with a wiping and cleaning material.

38. A process for producing an active matrix type light emitting device comprising the steps of:
   forming a thin film transistor over a substrate;
   forming a first insulating film comprising organic resin material over the thin film transistor;
   forming a second insulating film comprising inorganic insulating material on the first insulating film;
   forming a transparent conductive film formed on the second insulating film;
   patterning the transparent conductive film to form an anode; and
   wiping and cleaning the surface of the anode with a wiping and cleaning material.

39. The process for producing the active matrix type light emitting device according to claim 38, wherein the surface of the anode is made flat by the wiping and cleaning material.

40. The process for producing the active matrix type light emitting device according to claim 38, wherein the organic resin material is selected from the group consisting of polyacrylate, polyimide and polyamide.

41. The process for producing the active matrix type light emitting device according to claim 38, wherein the inorganic insulating material is selected from the group consisting of silicon oxide, silicon nitride, silicon oxide nitride, and silicon nitride oxide.

42. The process for producing the active matrix type light emitting device according to claim 38, wherein the wiping and cleaning material is a PVA-based porous body.

43. The process for producing the active matrix type light emitting device according to claim 38, wherein the anode is wiped and cleaned with the wiping and cleaning material and a washing liquid.

44. The process for producing the active matrix type light emitting device according to claim 38, wherein the surface of the anode is scrubbed with the wiping and cleaning material.

45. The process for producing the active matrix type light emitting device according to claim 38, wherein when contact angle to the surface of the anode is smaller than 90° before the wiping and cleaning, the contact angle after the wiping and cleaning is larger than the contact angle before the wiping and cleaning and is smaller than 90°.

46. A process for producing an active matrix light emitting device comprising the steps of:
   forming a thin film transistor over a substrate;
   forming a first insulating film comprising organic resin material over the thin film transistor;
   forming a second insulating film comprising inorganic material on the first insulating film;
   forming an electrode connected to the thin film transistor on the second insulating film;
   forming an anode formed on the electrode and the second insulating film; and
   wiping and cleaning the surface of the anode with a wiping and cleaning material.

47. The process for producing the active matrix type light emitting device according to claim 46, wherein the surface of the anode is made flat by the wiping and cleaning material.

48. The process for producing the active matrix type light emitting device according to claim 46, wherein the organic resin material is selected from the group consisting of polyacrylate, polyimide and polyamide.

49. The process for producing the active matrix type light emitting device according to claim 46, wherein the inorganic insulating material is selected from the group consisting of silicon oxide, silicon nitride, silicon oxide nitride, and silicon nitride oxide.

50. The process for producing the active matrix type light emitting device according to claim 46, wherein the wiping and cleaning material is a PVA-based porous body.

51. The process for producing the active matrix type light emitting device according to claim 46, wherein the anode is wiped and cleaned with the wiping and cleaning material and a washing liquid.

52. The process for producing the active matrix type light emitting device according to claim 46, wherein the surface of the anode is scrubbed with the wiping and cleaning material.

53. The process for producing the active matrix type light emitting device according to claim 46, wherein when contact angle to the surface of the anode is smaller than 90° before the wiping and cleaning, the contact angle after the wiping and cleaning is larger than the contact angle before the wiping and cleaning and is smaller than 90°.

54. A process for producing an active matrix type light emitting device comprising the steps of:
   forming a thin film transistor over a substrate;
   forming a first insulating film comprising organic resin material over the thin film transistor;
   forming a second insulating film comprising inorganic insulating material on the first insulating film;
   forming an anode on the second insulating film;
   wiping and cleaning the surface of the anode with a wiping and cleaning material; and
   forming an organic compound layer on the wiped and cleaned surface of the anode.

55. The process for producing the active matrix type light emitting device according to claim 54, wherein the surface of the anode is made flat by the wiping and cleaning material.

56. The process for producing the active matrix type light emitting device according to claim 54, wherein the organic resin material is selected from the group consisting of polyacrylate, polyimide and polyamide.

57. The process for producing the active matrix type light emitting device according to claim 54, wherein the inorganic insulating material is selected from the group consisting of silicon oxide, silicon nitride, silicon oxide nitride, and silicon nitride oxide.

58. The process for producing the active matrix type light emitting device according to claim 54, wherein the wiping and cleaning material is a PVA-based porous body.

59. The process for producing the active matrix type light emitting device according to claim 54, wherein the anode is wiped and cleaned with the wiping and cleaning material and a washing liquid.

60. The process for producing the active matrix type light emitting device according to claim 54, wherein the surface of the anode is scrubbed with the wiping and cleaning material.

61. The process for producing the active matrix type light emitting device according to claim 54, wherein when contact angle to the surface of the anode is smaller than 90° before the wiping and cleaning, the contact angle after the wiping and cleaning is larger than the contact angle before the wiping and cleaning and is smaller than 90°.

62. A process for producing an active matrix type light emitting device comprising the steps of:
   forming a thin film transistor over a substrate;
   forming a first insulating film over the thin film transistor;
   forming a second insulating film on the first insulating film;
   forming an anode comprising a transparent conductive film on the second insulating film; and
   wiping and cleaning the surface of the anode with a wiping and cleaning material.

63. The process for producing the active matrix type light emitting device according to claim 62, wherein the surface of the anode is made flat by the wiping and cleaning material.

64. The process for producing the active matrix type light emitting device according to claim 62, wherein the first insulating film comprises an organic resin material selected from the group consisting of polyacrylate, polyimide and polyamide.

65. The process for producing the active matrix type light emitting device according to claim 62, wherein the second insulating film comprises an inorganic insulating material selected from the group consisting of silicon oxide, silicon nitride, silicon oxide nitride, and silicon nitride oxide.

66. The process for producing the active matrix type light emitting device according to claim 62, wherein the wiping and cleaning material is a PVA-based porous body.

67. The process for producing the active matrix type light emitting device according to claim 62, wherein the anode is wiped and cleaned with the wiping and cleaning material and a washing liquid.

68. The process for producing the active matrix type light emitting device according to claim 62, wherein the surface of the anode is scrubbed with the wiping and cleaning material.

69. The process for producing the active matrix type light emitting device according to claim 62, wherein when contact angle to the surface of the anode is smaller than 90° before the wiping and cleaning, the contact angle after the wiping and cleaning is larger than the contact angle before the wiping and cleaning and is smaller than 90°.

70. A process for producing an active matrix type light emitting device comprising the steps of:
   forming a thin film transistor over a substrate;
   forming a first insulating film over the thin film transistor;
   forming a second insulating film on the first insulating film;
   forming an anode on the second insulating film;
   wiping and cleaning the surface of the anode with a wiping and cleaning material; and
   forming an organic compound layer on the wiped and cleaned surface of the anode.

71. The process for producing the active matrix type light emitting device according to claim 70, wherein the surface of the anode is made flat by the wiping and cleaning material.

72. The process for producing the active matrix type light emitting device according to claim 70, wherein the first insulating film comprises an organic resin material selected from the group consisting of polyacrylate, polyimide and polyamide.

73. The process for producing the active matrix type light emitting device according to claim 70, wherein the second insulating film comprises an inorganic insulating material selected from the group consisting of silicon oxide, silicon nitride, silicon oxide nitride, and silicon nitride oxide.

74. The process for producing the active matrix type light emitting device according to claim 70, wherein the wiping and cleaning material is a PVA-based porous body.

75. The process for producing the active matrix type light emitting device according to claim 70, wherein the anode is wiped and cleaned with the wiping and cleaning material and a washing liquid.

76. The process for producing the active matrix type light emitting device according to claim 70, wherein the surface of the anode is scrubbed with the wiping and cleaning material.

77. The process for producing the active matrix type light emitting device according to claim 70, wherein when contact angle to the surface of the anode is smaller than 90° before the wiping and cleaning, the contact angle after the wiping and cleaning is larger than the contact angle before the wiping and cleaning and is smaller than 90°.

* * * * *